(12) United States Patent
Garvey et al.

(10) Patent No.: US 12,169,803 B2
(45) Date of Patent: Dec. 17, 2024

(54) SYSTEMS AND METHODS FOR AUTOMATING COMPARATIVE USER EXPERIENCE TEST ANALYSES

(71) Applicant: Wevo, Inc., Boston, MA (US)

(72) Inventors: Dustin Garvey, Exeter, NH (US); Frank Chiang, Boston, MA (US); Alexa Stewart, Andover, MA (US); Janet Muto, Boston, MA (US); Andrea Paola Aguilera García, Cambridge, MA (US); Nitzan Shaer, Boston, MA (US); Alexander Barza, Cambridge, MA (US)

(73) Assignee: Wevo, Inc, Boston, MA (US)

( * ) Notice: Subject to any disclaimer, the term of this patent is extended or adjusted under 35 U.S.C. 154(b) by 0 days.

(21) Appl. No.: 18/505,951

(22) Filed: Nov. 9, 2023

(65) Prior Publication Data

US 2024/0320591 A1    Sep. 26, 2024

Related U.S. Application Data

(60) Provisional application No. 63/502,351, filed on May 15, 2023, provisional application No. 63/492,194, filed on Mar. 24, 2023.

(51) Int. Cl.
*G06Q 10/0637* (2023.01)
*G06F 11/34* (2006.01)
(Continued)

(52) U.S. Cl.
CPC ..... *G06Q 10/0637* (2013.01); *G06F 11/3438* (2013.01); *G06F 16/345* (2019.01); *G06F 30/27* (2020.01); *G06Q 30/0203* (2013.01)

(58) Field of Classification Search
None
See application file for complete search history.

(56) References Cited

U.S. PATENT DOCUMENTS 10,592,077 B1   3/2020   Goldstein et al.
11,030,631 B1   6/2021   Mascaro et al.
(Continued)

FOREIGN PATENT DOCUMENTS

CN   106169083 A   * 11/2016   ........... G06K 9/6215
CN   109388227 B   *  9/2021   ............. G06F 3/013

OTHER PUBLICATIONS

Bin et al "Measuring and Improving User Experience Through Artificial Intelligence-Aided Design", Nov. 2020, Anticipatory Systems: Humans Meet Artificial Intelligence, pp. 1-25 (Year: 2020).*

*Primary Examiner* — Romain Jeanty
(74) *Attorney, Agent, or Firm* — Invoke

(57) ABSTRACT

Techniques are described herein for using artificial intelligence (AI) and machine learning (ML) to automate, accelerate, and enhance various aspects of comparative user experience testing. Embodiments interface with generative language models to compare user experiences and summarize the results of the comparison. In some embodiments, automated systems and programmatic processes access a series of analysis contexts, where a context includes a collection of message content fragments. The systems and processes may use the message content fragments for a given context to construct a dialogue with a generative language model to compare separate user experiences based on the results of a set of user experience tests. The output of the generative language model at one stage of the analysis may be combined with content fragments for another context to craft a dialogue at another stage of the analysis and/or to perform additional analyses of the user experiences.

20 Claims, 4 Drawing Sheets

(51) Int. Cl.
*G06F 16/34* (2019.01)
*G06F 30/27* (2020.01)
*G06Q 30/0203* (2023.01)

(56) References Cited

U.S. PATENT DOCUMENTS

| | | |
|---|---|---|
| 11,676,183 B1 | 6/2023 | Andrews et al. |
| 12,008,308 B1 * | 6/2024 | Zimmerman ......... G06F 40/274 |
| 2015/0154634 A1 * | 6/2015 | Chiu .................. G06Q 30/0253 |
| | | 705/14.51 |
| 2020/0005157 A1 | 1/2020 | Rosenstein et al. |
| 2020/0160229 A1 | 5/2020 | Atcheson |
| 2023/0112780 A1 | 4/2023 | Alejandro |
| 2023/0187813 A1 | 6/2023 | Mestres et al. |
| 2023/0316006 A1 | 10/2023 | Tunstall-Pedoe et al. |
| 2024/0144107 A1 | 5/2024 | Garvey et al. |
| 2024/0168776 A1 | 5/2024 | Kadam |

* cited by examiner

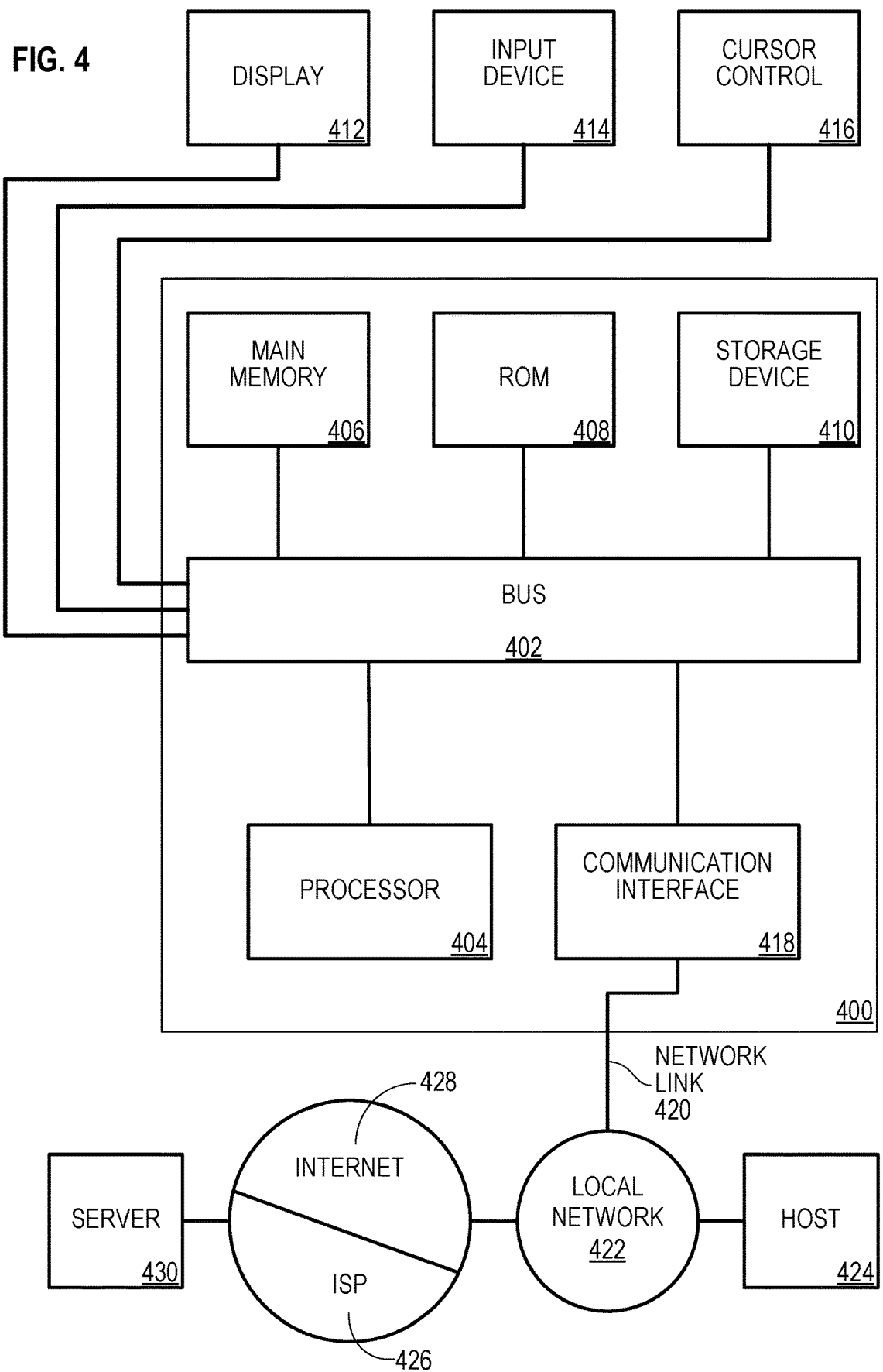

SYSTEMS AND METHODS FOR AUTOMATING COMPARATIVE USER EXPERIENCE TEST ANALYSES

INCORPORATION BY REFERENCE; DISCLAIMER

Each of the following applications are hereby incorporated by reference: Application No. 63/492,194 filed on Mar. 24, 2023; Application No. 63/502,351 filed on May 15, 2023. The Applicant hereby rescinds any disclaimer of claim scope in the parent application(s) or the prosecution history thereof and advises the USPTO that the claims in this application may be broader than any claim in the parent application(s).

This application is related to U.S. application Ser. No. 18/306,028, titled, Scalable Systems and Methods for Discovering and Summarizing Test Result Facts, U.S. application Ser. No. 17/981,243, titled Scalable Systems and Methods for Curating User Experience Test Results, and U.S. application Ser. No. 18/306,030, titled Quantitative Split Driven Quote Segmentation, the entire contents for each of which are hereby incorporated by reference as if set forth in their entirety.

TECHNICAL FIELD

The present disclosure relates, generally, to user experience testing. In particular, the present disclosure relates to artificial intelligence (AI) based systems and methods for optimizing user experience testing administration and analyses.

BACKGROUND

User experience (UX) design encompasses tools and applications for optimizing how users interact with a system, which may be comprised of physical and/or digital interfaces. Example tools used by UX researchers include surveys, which may be administered online to users of a product or service. Survey results may include qualitative and quantitative data that provide insights into various facets of user experiences with the product or service. Such insights may help isolate areas of the product or service that are underperforming and indicate what design changes are most likely to improve the user experience.

User researchers and product designers generally have two options when performing UX testing. The first is to compose and administer the tests using existing or custom-built frameworks. For example, a framework may allow users to create custom survey questions and target a panel with particular demographics. In this scenario, the researcher bears the burden of determining how the tools should be composed and how the results should be analyzed. The researcher may not have the time or expertise to effectively run UX tests and identify the highest-quality test results. Poorly crafted tests and analyses may lead to suboptimal product design choices and the inefficient use of resources.

Researchers may also outsource UX testing to a third-party service provider. In this scenario, the service provider may use proprietary tools to perform the UX tests and analyze the results. Third-party service providers may leverage their expertise in conducting and administering tests. However, it may be difficult for service providers to identify the test results that are most relevant to the specific customer. In addition, the analyses are often decomposed into manual tasks that are tightly coupled to the specific customer. As a result, extracting useful and actionable insights is typically an expensive, cumbersome, and inefficient process.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings:

FIG. 4 illustrates a computer system in accordance with some embodiments.

DETAILED DESCRIPTION

Figure 1:
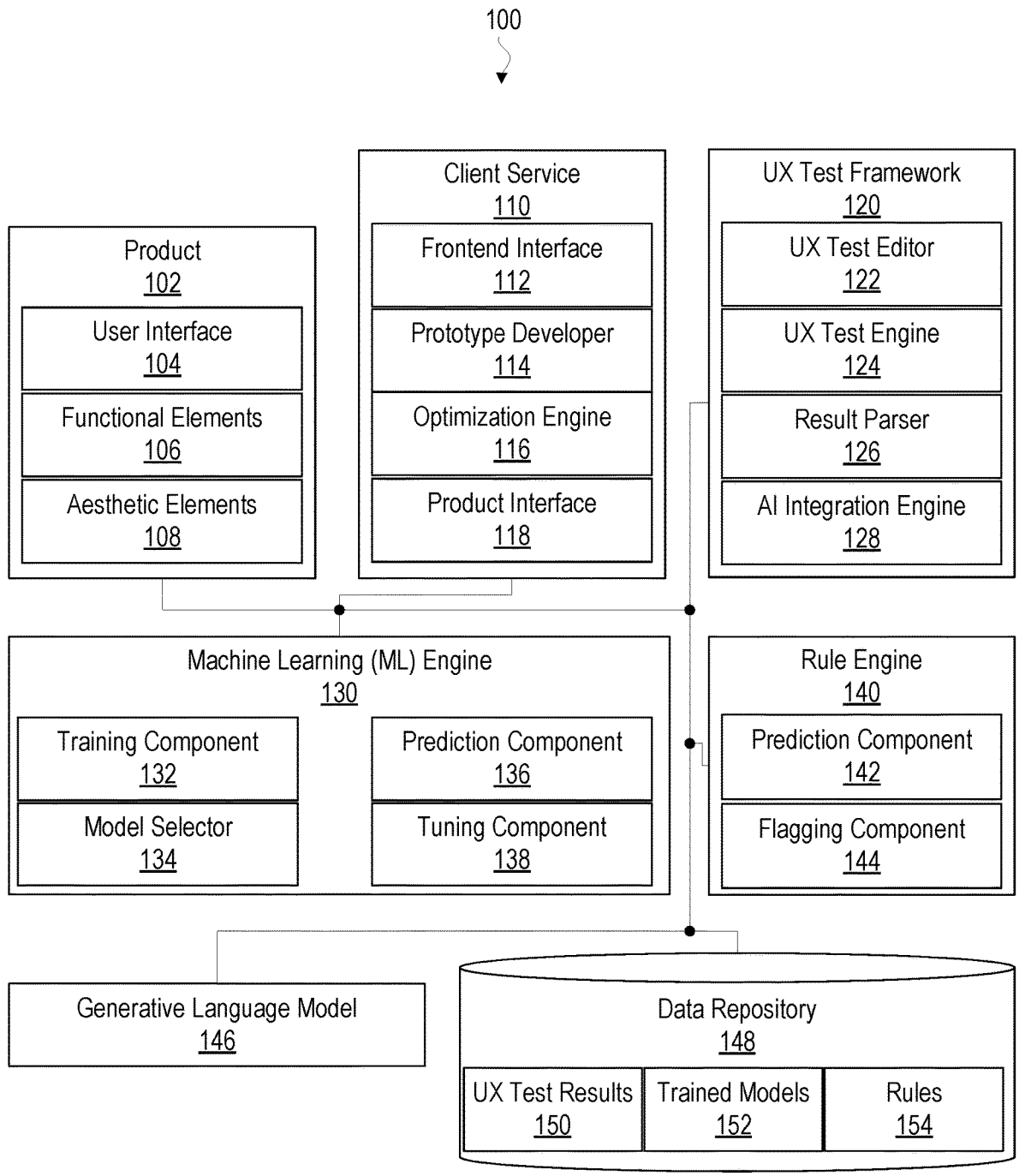
FIG. 1 illustrates an example system architecture in accordance with some embodiments.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW

Techniques are described herein for using artificial intelligence (AI) and machine learning (ML) based models to automate, accelerate, and enhance various aspects of user experience testing. Embodiments herein include deeply incorporating generative language models into user experience testing applications to extract key findings for improving product designs and driving product optimizations. The AI-based techniques allow for significant reductions in processing overhead associated with extracting key findings and insights from user experience test results. In particular, the techniques may reduce the time from user testing to implementing product design improvements, thereby increasing the efficiency and efficacy of user experience testing systems and applications. The AI-based techniques may further provide insights that are not readily apparent from the raw user experience test results, driving changes to product designs that are most likely to optimize user experiences.

Embodiments described herein include systems and programmatic processes that generate a set of inputs for a generative language model as a function of a set of results for a user experience test and a set of contexts that are defined for the test. In some embodiments, the systems and programmatic processes use prompt engineering to craft a set of prompts that direct the generative language model to operate from the point of view of a user researcher and extract key findings from a set of user experience test results. The systems and programmatic processes may interface with the generative language model using unstructured natural language prompts that are generated based in part on structured and/or unstructured test result data. Based on training over a large corpus of data, the generative language model may generate natural language (unstructured) text that is similar to text written by humans in response to the prompts.

In some embodiments, the systems and programmatic processes engage in a dialogue with the generative language model using the set of prompts crafted for a given context and set of test results. The automated process may parse the outputs of the generative language model to generate one or more findings for each text context. The unstructured output of the language model may be integrated into a structured analysis of the user experience test results that provide key insights into what facets of the user experience are underperforming, performing at acceptable levels, or performing well. The automated analysis may optionally be curated by an analyst before being presented to an end user, such as a customer or product designer. Additionally or alternatively, the automated analysis may drive other automated actions directed toward optimizing product designs.

Embodiments further include systems and programmatic processes that use AI-based services to compare multiple analyses of user experiences. Comparisons may be useful in scenarios such as:

Testing and comparing multiple versions of the same experience. Outcomes may include selecting the best candidate experience for further development/release or identifying development options for better candidate user experiences.

Testing and comparing competitive products. Outcomes may include identifying deficits in a target user experience relative to the competition or characterizing viable solutions in a category.

Comparing analysis of a portfolio of experiences. Outcomes may include identifying common and consistent positives and negatives.

The above list is not intended to be exhaustive as comparisons may be used for other applications that drive the optimization of user experiences with a product.

In some embodiments, the techniques include configuring and applying a generative language model to compare user experiences and summarize the results of the comparison. Automated systems and programmatic processes may access a series of analysis contexts, where a context includes a collection of message content fragments. The systems and processes may use the message content fragments for a given context to construct a dialogue with a generative language model to compare separate user experiences based on the results of a set of user experience tests. The output of the generative language model at one stage of the analysis may be combined with content fragments for another context to craft a dialogue at another stage of the analysis and/or to perform additional analyses of the user experiences.

In some embodiments, the process of applying the generative language model includes a plurality of stages including a first stage for summarizing a set of user experiences and a second stage for generating a comparative analysis of the user experiences. In the first stage, an input prompt for the generative language model may be constructed as a function of a set of user experience test results and message content fragments for the given context. For example, a dialogue message may prompt the generative language model to create a bullet point summary of the key findings of a set of user experience test results. In the second stage, an input prompt for the generative language model may be constructed as a function of the summaries output in the first stage and the context fragments associated with the second stage. The output may be packaged into a comparison report to identify how user experiences compare relative to one another. The comparison report may be used to populate analyst work queues, suggest changes to a user experience to address identified weaknesses, select between multiple potential user experiences, and/or perform other actions associated with updating a product design to improve user experiences with the product.

One or more embodiments described in this Specification and/or recited in the claims may not be included in this General Overview section.

2. SYSTEM ARCHITECTURE

FIG. 1 illustrates an example system architecture in accordance with some embodiments. As illustrated in FIG. 1, system architecture 100 includes product 102, client service 110, user experience (UX) test framework 120, machine learning (ML) engine 130, rule engine 140, generative language model 146, and data repository 148. In some embodiments, system architecture 100 may include more or fewer components than the components illustrated in FIG. 1. The components illustrated in FIG. 1 may be local to or remote from each other. The components illustrated in FIG. 1 may be implemented in software and/or hardware. Each component may be distributed over multiple applications and/or machines. Multiple components may be combined into one application and/or machine. Operations described with respect to one component may instead be performed by another component.

Product 102 refers to an item or service with which users may interact. Examples include articles of manufacture, software applications, cloud computing services, websites, virtual assistants, and other computing-based systems. Product 102 includes user interface 104 for interacting with one or more users. In some embodiments, product 102 is a good or service that exists in a digital form (a "digital" product). Examples include websites, mobile applications, cloud services, digital media, and/or other digital assets.

Product 102 includes user interface 104 for interacting with one or more users. In the context of a digital product, user interface 104 may render a set of user interface elements and receives input via the rendered user interface elements. A user interface for a digital product 102 may include a graphical user interface (GUI), a command line interface (CLI), an application programming interface (API), a haptic interface, and/or a voice command interface. Example user interface elements include checkboxes, radio buttons, dropdown lists, list boxes, buttons, toggles, text fields, date and time selectors, command lines, sliders, pages, and forms. User interfaces for other types of products may include buttons, levers, knobs, dials, and/or other physical elements through which a user may manipulate and interact with product 102.

In some embodiments, product 102 includes functional elements 106 and aesthetic elements 108, which may affect the user experience with respect to product 102. Functional elements 106 may include user interface controls through which the user may operate product 102 and/or affect the output of product 102. Functional elements 106 may further comprise backend processes and/or systems with which a user does not directly interact, but which may affect a user's experience with product 102, such as a perceived responsiveness or quality of product 102. Aesthetic elements 108 may generally comprise nonfunctional components of product 102 including the look and feel of user interface 104 and/or other visual design elements of product 102.

UX test framework 120 includes components for composing and running UX tests. The components may include UX test editor 122, UX test engine 124, result parser 126, and AI integration engine 128. A UX test may comprise applications, tools, and/or processes for evaluating the performance of various facets of one or more user experiences with product 102. For example, a UX test may comprise a survey or questionnaire. Users of a website or a mobile application may be prompted to complete the UX test to evaluate their experience with product 102, which may be the website or application itself or a separate product. If the user accepts the prompt, the user may be redirected to a webpage with a set of queries to describe and/or rank various facets of the user experience with product 102.

Additionally or alternatively, a UX test may obtain performance data for one or more UX facets using mechanisms for tracking how a user interacts with product 102. For example, scripting tags that embed executable code in a website or backend processes, such as daemons, may track and collect metrics and/or other information about user interactions with product 102. Example metrics may include how long it takes a user to first interact with a user interface element, how long it takes a user to complete a task using user interface 104, how long a user engages with product 102, how long it takes for pages of user interface 104 to load, which products features are most frequently accessed, and which product features are least frequently accessed.

Additionally or alternatively, a UX test may obtain information about user experiences from other data sources. For example, a web scraper may crawl one or more websites for user reviews of a product to extract information about which product features are viewed most positively, which product features are viewed most negatively, what scores have been assigned for different features of the product, and what overall product score has been assigned. Additionally or alternatively, the UX test may scrape social media sites for posts tagged with a product identifier and extract information from the posts about how users interact with the product. In yet another example, a UX test may search customer databases and/or other sources to determine what percentage of users have returned a product, submitted a customer support ticket, or submitted a product complaint. A UX test may assign scores based on the extracted information using a scoring function or machine learning, where a UX test score quantifies one or more user experiences with respect to one or more facets of the user experience. Although only one product is illustrated in FIG. 1, a given UX test may be run for several different products and several different UX tests may be run for the same product.

UX test editor 122 is a tool through which users may compose and customize UX tests. For example, UX test editor 122 may include one or more GUI elements through which a user may select predefined survey questions, input new questions, define scripts for capturing performance metrics, and/or otherwise customize test applications to evaluate user experiences with product 102. UX test editor 122 may further allow users to define parameters associated with running a UX test, such as what segment to target, what platform to use running the test, and/or other parameters controlling how the UX test is run.

UX test engine 124 runs tests defined through UX test editor 122. A UX test may include a query mechanism to prompt or search for data describing or quantifying one or more facets of a user experience. For example, UX test engine 124 may prompt a sample set of visitors to a webpage to complete a survey describing and/or ranking various facets of a user experience with product 102. As another example, UX test engine 124 may capture webpage usage metrics from the set of visitors using scripting tags and/or scrape review sites for information describing product 102, as previously described. The tests may be run in accordance with the parameters input through UX test editor 122. The results of a UX test may include qualitative elements describing the user experience and/or quantitative elements that quantify the user experience.

Result parser 126 parses the results of UX tests to extract qualitative elements from the result set. For example, result parser 126 may extract quotations or responses to survey questions about a particular facet of a user experience. Result parser 126 may further extract additional information about individual qualitative elements and/or groups of qualitative elements, including attributes about the author of a quotation, what question a quotation is responding to, and what quantitative score the respondent gave to a facet of the user experience that is described by the quotation.

AI integration engine 128 interfaces with one or more generative language model services to analyze, compare, and extract key insights from UX test results for user experiences with one or more products. AI model integration engine 124 may interface with a generative language model service by executing one or more processes that form model input prompts for engaging in a dialogue with the model. For example, the processes may create input prompts by combining prompt fragments with conditioned test results and/or outputs extracted from the model during the dialogue as discussed in further detail below.

ML engine 130 uses machine learning to build models based on sample UX test data. For example, ML engine 130 may train a set of ML models to predict visibility scores for quotations with respect to a user interface or portion of the user interface. Additionally or alternatively, ML engine 130 may build models for making predictions on UX test data for other contexts. Examples are described further in the sections below. ML engine 130 may include training component 132 for building the set of ML models, model selector 134 for selecting ML models to apply based on context, prediction component 136 for applying ML models to results extracted by result parser 126, and tuning component 138 to make runtime adjustments to ML models based on feedback.

Rule engine 140 performs rule-based prediction and/or flagging. For example, rule engine 140 may generate a visibility score for quotations and/or flag quotations based on predefined rules. Rules allow developers to hard code patterns into the system to ensure the patterns are not missed or given little weight by the machine learning processes. Rule engine 140 may comprise prediction component 142 for applying prediction rules to results extracted by result parser 126, and flagging component 144 for applying flagging rules to the results.

Generative language model 146 provides natural language responses to inputs. In some embodiments, generative language model 146 predicts the next word in a sequence given the context of the previous words. During training, generative language model 146 may be exposed to large amounts of text data and learn to recognize patterns and relationships within language. Generative language model 146 may use deep learning and/or other machine learning techniques to process and generate text. Generative language model 146 may be an external service, such as ChatGPT, Jasper Chat, or other large language models (LLMs). In other cases, generative language model 146 may be a native service. The underlying architecture for a generative language model may vary depending on the particular implementation.

Example architectures include for generative language model 146 may include:

a. Recurrent neural networks (RNNs): RNNs are a class of neural networks designed to handle sequential data, making them suitable for processing sequences of words in a sentence. RNNs maintain an internal state (hidden state) that is updated with each new input word. The hidden state carries information from previous words and influences the predictions for the next word. This process is referred to as "unrolling" the RNN through time. During training, the RNN is fed sequences of words, and it learns to predict the next word in a sequence given the context of the previous words. One technique, referred to as "teacher forcing," occurs where the true next word is provided during training to help guide the learning process. The model is optimized to minimize the difference between its predictions and the actual next words in the training data. Long Short-Term Memory (LSTM) and Gated Recurrent Unit (GRU) RNNs may be used to capture long-range dependencies in text.

b. Transformers-based models: Unlike RNNs, transformers process the entire sequence of words simultaneously, allowing these models to better capture long-range dependencies in the text. In the transformer model, the input text is split into word embeddings, which represent each word as a high-dimensional vector. These embeddings are then passed through multiple layers of self-attention and feedforward neural networks. The self-attention mechanism allows the model to weigh the importance of each word in the context of the entire sequence, enabling it to focus on relevant words for generating the next word. During training, the model is exposed to vast amounts of text data and learns to predict the likelihood of each word occurring given its context. This process involves adjusting the model's parameters (weights) to minimize the difference between its predictions and the actual words in the training data. The transformer model can be fine-tuned on specific tasks or used as a pre-trained language model for various downstream tasks.

In some embodiments, generative language model 146 is configured to simulate a UX researcher and summarize user experiences with digital product 102. The model may be configured using a set of one or more message fragments, which may include a specification defining parameters for the model's analysis. The message fragment(s) may be combined with information about a product page, such as text summarizing an image of a digital experience, which may have been previously generated by generative language model 146, and/or text extracted from UX test results. Example message fragments and prompts are described in further detail below.

In some embodiments, generative language model 146 is configurable to represent various points of view of a target audience through prompt engineering. Configuring generative language model 146 may include sending the model a steering message, which is a prompt that explicitly or implicitly specifies the point of view for the generative language model to represent during execution of one or more tasks. For example, a steering message may specify that generative language model 146 represents individuals that have a certain role, live in a particular region, fall within a particular age range, and/or possess a set of one or more other attributes.

When generative language model 146 receives a prompt that explicitly specifies the point of view for the model to adopt, the model may use the prompt to bias its generated output towards the specified perspective. One approach is for generative language model 146 to process the prompt, including the explicit specification of the desired point of view, and use the context to set the initial conditions for generating text. The model's internal state may be adjusted based on the prompt. For example, the attention mechanism of a language model using a transformer architecture may emphasize the relevant parts of a prompt that pertain to the specified perspective. Stated another way, the attention mechanism that assigns token-level attention weights, attention scores and/or other attention parameters within the transformer-based language model may operate differently from one simulated point of view to another where the attention weights assigned to a given input for one point of view may differ significantly from the weights for a different point of view to simulate different perspectives between different target audiences. Additionally or as an alternative, generative language models may represent different points of view using other mechanisms, such as contextual embeddings that capture the context mentioned in the prompt and/or biasing output toward a perspective. The generative language model may thus generate text while taking into account the specified point of view, which may influence the model's output including the choice of words, phrases, and overall tone of the generated text.

Data repository 148 stores and fetches data including UX test results 150, trained models 152, and rules 154. In some embodiments, data repository 148 is any type of storage unit and/or device (e.g., a file system, database, collection of tables, or any other storage mechanism) for storing data. Further, data repository 148 may include multiple different storage units and/or devices. The multiple different storage units and/or devices may or may not be of the same type or located at the same physical site. Further, data repository 148 may be implemented or executed on the same computing system as one or more other components of system architecture 100. Alternatively or additionally, data repository 148 may be implemented or executed on a computing system separate from one or more other system components. Data repository 148 may be communicatively coupled to remote components via a direct connection or via a network.

Client service 110 may comprise applications, tools and systems used by product designers and/or third-party service providers that run specialized UX tests. In some embodiments, client service 110 comprises frontend interface 112, prototype developer 114, optimization engine 114, and product interface 118. Frontend interface 112 may comprise a user interface for presenting analytics, recommended actions, and/or other information based on the predictions. For example, frontend interface 112 may generate and render interactive charts that allow a user to access and navigate AI-generated findings, analyses, comparisons performance benchmarks, and UX test results. The user may view AI-generated insights into which facets are underperforming relative to peer products, the most informative qualitative descriptions indicative of why the facets underperformed, and actions to address the problems.

Prototype developer 114 is an application or service for creating and editing product prototypes. User interface prototypes may comprise a set of frames that represent individual screens or pages of an app or website. The frames may be linked together with interactive hotspots or buttons, which may trigger actions such as navigating to another screen. Creating a prototype of a user interface allows designers to test and refine user interface designs before the interface is fully developed or deployed. Prototype developer 114 may allow users to create prototype using a set of prototype primitives.

A prototype primitive refers to a basic design element or building block that may be used to create a mockup or model of a user interface design. For example, a primitive may include visual elements, such as shapes and images, which may be combined to represent the design of a webpage or application page. Primitives may be customized in a variety of ways, including changing the size, color, stroke width, and opacity of the element. A primitive may be combined with one or more other primitives to create more complex designs and shapes. Primitives allow designers to quickly create basic design elements without requiring more advanced design skills or hard coding of the underlying application logic. A set of primitives may represent the overall look and feel of a website or application interface. The set of primitives may further encapsulate some basic functions that trigger actions when selected by a user, such as navigating to a different page, generating a pop-up window, presenting a user prompt, or executing a function that simulates the experience of a fully developed version of the interface.

In other embodiments, prototype developer 114 may create prototypes from fully developed digital products. For example, prototype developer 114 may crawl a live website through the world wide web and create images for one or more webpages. The live design may be used as a reference for comparison between a new or updated design before it is fully deployed to replace the previous design. Additionally or alternatively, the live design may be used as a reference for comparison with a competing product design. UX tests may be conducted on fully developed user interfaces or prototypes Optimization engine 116 may comprise logic for updating and/or recommending changes to product designs based on the AI-generated insights. For example, optimization engine 116 may determine which facets are underperforming and which solutions are predicted to improve performance with respect to the facet based on the AI analyses and comparison. For instance, optimization engine 116 may predict that a change in the size, position, textual content, image content, layout, and/or function of a user interface component would improve UX test results associated with a particular facet of the design. The change may be recommended by optimization engine 116 to a product designer or automatically implemented by the engine. As another example, optimization engine 116 may predict that inclusion of a user interface component that is lacking in the current design would improve the UX scores or that removing a user interface component would improve UX test scores. Based on the predictions, optimization engine may generate recommendations, annotate the prototype design, update the design (e.g., by adding, modifying, removing components on a webpage or application page), and/or perform other actions for improving user experiences with product 102.

Product interface 118 may be communicatively coupled to product 102 and allow client service 110 to invoke and/or execute functions on product 102. For example, product interface 118 may include an application programming interface (API) endpoint to send requests to a software application or service to execute a requested change in the user interface. As another example, product interface 118 may invoke an editor to change a webpage associated with product 102. The requests and functions that are invoked may be directed to improving underperforming facets of product 102.

The components illustrated in FIG. 1 may be implemented on one or more digital devices. The term "digital device" generally refers to any hardware device that includes a processor. A digital device may refer to a physical device executing an application or a virtual machine. Examples of digital devices include a computer, a tablet, a laptop, a desktop, a netbook, a server, a web server, a network policy server, a proxy server, a generic machine, a function-specific hardware device, a hardware router, a hardware switch, a hardware firewall, a hardware network address translator (NAT), a hardware load balancer, a mainframe, a television, a content receiver, a set-top box, a printer, a mobile handset, a smartphone, a personal digital assistant (PDA), a wireless receiver and/or transmitter, a base station, a communication management device, a router, a switch, a controller, an access point, and/or a client device.

One or more components illustrated in FIG. 1, may be implemented as a cloud service or a microservice application. Tenants may subscribe to a cloud service to track UX benchmark scores of a product, view the most helpful qualitative data highlighting the product design features that excelled or underperformed, and implement recommended actions to improve the product design. Additional embodiments and examples relating to computer networks are described below in Section 6, titled *Computer Networks and Cloud Networks*. Additional embodiments and examples relating to computer networks are described below in Section 7, titled *Microservice Applications*.

3. AUTOMATED ANALYSES USING GENERATIVE LANGUAGE MODELS

Embodiments herein process the results of user experience tests that have been run with respect to a plurality of respondents. In some embodiments, an automated process begins with a set of contexts that are defined for the test. A context may be determined based on a set of one or more attributes associated with a set of UX test results (or subset therein). For example, U.S. application Ser. No. 18/306,028 includes examples of result categories and sub-categories for a set of UX test results. An example category includes a diagnostic result and a sub-category is a negative diagnostic result. Other categories and/or sub-categories include expectation elements, custom elements, and heatmaps. A brief summary of these contexts is described below. However, as may be appreciated, the contexts may vary depending on the architecture of the UX test.

As previously noted, a UX result category may include a diagnostic results. A diagnostic result refers to an element that quantitively or qualitatively diagnoses a facet of the user experience. For example, a diagnostic result may include a diagnostic quote describing whether a facet of the user experience was positive, neutral, or negative, and the reasons for the diagnosis. Additionally or alternatively, a diagnostic result may score the facet or select a description from a predefined schema (e.g., "positive", "somewhat positive", "neutral", "somewhat negative", "negative", etc.)

Additionally or alternatively, expectation elements may be captured by a UX test. An expectation element is a result that identifies an expectation of a user with respect to a product and whether the expectation was met or unmet during the UX test. For example, an expectation element may include an "expectation quote" that describes the user's expectations without being confined to a schema, an "outcome quote" that describes the outcome for an associated expectation (also without being confined to a schema), and an outcome selected from a predefined schema (e.g., "fully met", "somewhat met", "unmet", etc.). The triplet of the unstructured expectation quote, unstructured outcome quote, and selected outcome may be part of an expectation element collected by UX test framework 118. In other embodiments, an expectation element may include additional information associated with a user's expectations with product 102 and/or may omit one or more items from the triplet.

Additionally or alternatively, UX tests may include custom elements that are inserted by the product designer or test administrator. A custom test element may include custom-defined questions, schemas, scripts, or other code. A custom test result includes the user's response or otherwise captures the user's interaction with the custom element. For example, the response may include a user's answer to a custom-defined question.

Additionally or alternatively, UX tests may capture heatmap elements, which may include qualitative and/or quantitative test result data that is tied to a particular location within a webpage or application page. Heatmap data may be captured by the user selecting a particular area within a page and inputting qualitative and/or quantitative data that is associated with the selected page region. For example, the user may input one or more quotations that describes a positive attribute and/or a negative attribute of a particular user interface element on the page. As another example, the user may be prompted to input a score representing a perceived effectiveness or quality of the user interface element.

In some embodiments, the contexts drive how an automated analytic process interacts with generative language model 146. For example, the context may drive how the analytic process crafts input prompts to the model and processes the model's outputs. The prompt for a set of diagnostic results may be crafted differently than the prompts for expectation elements, which may be different than for heatmap elements, etc. Different contexts may be associated with different message fragments affecting the flow of the dialogue between the automatic analytic process and the generative language model. The automated process may fetch message fragments from a database that are mapped to a given context and create the input prompt using the fetched message fragment and associated UX test results.

Figure 2:
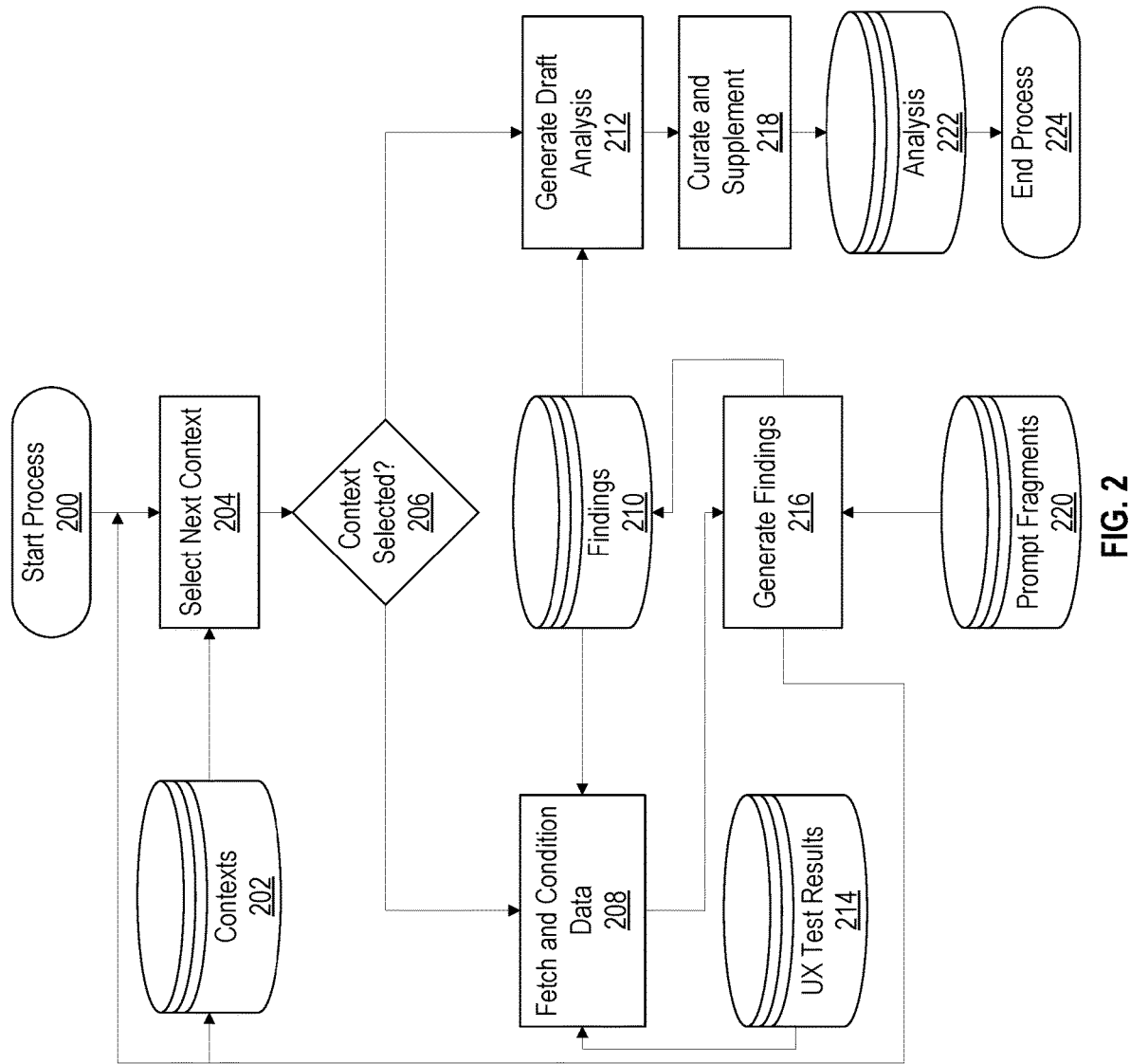
FIG. 2 illustrates a process diagram for performing an automated analysis of a user experience test using a generative language model in accordance with some embodiments.

FIG. 2 illustrates a process diagram for performing an automated analysis of a user experience test using a generative language model in accordance with some embodiments. One or more operations illustrated in FIG. 2 may be modified, rearranged, or omitted all together. Accordingly, the particular sequence of operations illustrated in FIG. 2 should not be construed as limiting the scope of one or more embodiments.

Referring to FIG. 2, the process starts at operation 200. In some embodiments, the process may be triggered in response to detecting that a new set of UX test results has been received from a plurality of test respondents. In other embodiments, a user, such as an analyst or product designer, may initiate the process. For example, UX test framework 120 may provide a user interface component that allows the user to request an AI-based analysis for a specified set of UX test results.

At operation 204, the process selects a first context for analysis. In some embodiments, the process determines what contexts are associated with the UX test that was run. To determine the context, the process may parse the UX test, UX test results, and/or UX test metadata to identify categories and sub-categories associated with various test elements. The UX test may determine which categories and/or sub-categories are mapped to a stored context within context database 202. For example, the UX test may determine that a portion of a UX test includes a set of diagnostic elements, including positive, neutral, and negative sub-categories. Each sub-category may be mapped to a different context or the entire category may be mapped to the same context, depending on the particular implementation.

At operation 206, the process determines whether a context was selected. The process may iteratively interact with the generative language model to create findings until there are no further contexts after which an AI-generated summary may be generated, as discussed further herein.

At operation 208, the process fetches and conditions the UX test results (from UX test results database 214) and/or AI-generated findings (from findings database 210) for the selected context. With early contexts, there may be no available or relevant AI-generated findings to condition within findings database 210. Thus, fetching and conditioning may be applied only to the UX test results in UX test result database 214 rather than any previously computed findings. As findings are generated through the dialogue with the generative language model, the process may condition the AI-generated findings relevant to the selected context.

In some embodiments, the process conditions the results and/or findings to optimize the automated dialogue with the generative language model. Conditioning the data may help avoid exceeding the token limit of the generative language model while increasing the quality of the input prompt by removing extraneous and/or low-quality UX test results. With respect to qualitative test results, the process may condition the data by performing quote selection. For example, the process may collect all quotes that are relevant to the context and use an ML model to select high-quality quotes. Examples ML model implementations for selecting high-quality quotes from UX test results are described in U.S. application Ser. No. 17/981,243 where the model is trained and tuned based on feedback to predict visibility scores for a set of quotations. In this case, the conditioning process may apply the model and retain the top n scored quotes. However, the specific ML model used to select quotes may vary depending on the particular implementation. The result of the conditioning operation is to collect and prepare the data for the current context.

At operation 216, the process interacts with a generative language model to generate findings, which are stored in findings database 210. In this operation, the process fetches the prompt fragments that are relevant to the context from prompt fragments database 220 and uses the fragments to orchestrate a dialogue with the generative language model. In some embodiments, the prompt fragments vary depending on the context. For example, a context for positive diagnostics may be mapped to a different set of prompt fragments than a context for expectations that have been met, which may be different than heatmap clicks, etc. The process may construct a dialogue using the prompt fragments, conditioned UX test result data, and/or conditioned findings.

In some embodiments, a dialogue for a given context includes multiple input prompts to the generative language models. For example, the process may construct an initial prompt that includes a steering message directing the model to adopt a particular point-of-view, a conditioned set of UX test results and/or findings for the given context, and prompt fragments directing the generative model to perform a particular task from the perspective of the point-of-view given the set of conditioned data. In response, the generative language model may create a natural language response by feeding the input prompt through the transformer-based neural network architecture previously described to predict a sequence of tokens.

In some embodiments, the process may analyze the output to determine whether to package the output as a finding or may continue the dialogue to refine and fine-tune the finding. If the process continues the dialogue, then the process may craft additional input prompts using message fragments and/or conditioned data, which may be identified based on a predefined message fragment flow and/or as a function of an analysis of the model output. For instance, if the process determines that the finding length exceeds a threshold number of tokens, the process may create a new input prompt requesting that the generative language model rephrase and reduce the number of words in the previously generated model output. In other cases, the additional input prompt may be generated as part of a predefined sequence by selecting the next message fragment in the sequence, which may be a standalone input or be combined with conditioned data to create the input prompt. Additionally or alternatively, the process may specify other parameters for the generative language model to refine the finding. Some additional examples may include creating bulleted lists, removing statistics, adding statistics, dropping topic sentences, removing redundancies, and/or otherwise structuring the finding in a particular manner. The dialogue may continue crafting additional input prompts and processing responses until the finding satisfies a set of parameters or the dialogue has been exhausted. A finding may be discarded if it does not satisfy the set of parameters or is determined to be low quality based on the automated analysis.

An example dialogue flow as part of operation 216 is presented in Table 1 below. Content from "automation" is the developed prompt and "assistant" is the language model's completion. As may be seen, this dialogue is for analyzing expectation responses. This example is included for clarity and, as previously mentioned, t each context may have a distinctly different dialogue. The specific dialogue may further be coupled with a specific language model used to generate the finding, which may vary from one context to the next.

Example 1: Example Model Prompts and Outputs

--automation--
You are a helpful user experience researcher.
--automation--
A digital experience was tested and 'The school is affordable and won't put me in debt' was identified as a common expectation for 'Online' in the 'Higher Ed' industry. Respondents left the experience with following outcome distribution.
42% had the expectation met
40% had the expectation somewhat met
19% had the expectation unmet
Respondents were asked to provide detail about their selected outcome. The best responses for each outcome are provided below.
met expectations
Discussed low debt
It shows that it has the least debt.
It has one of the most affordable tuition rates.

Example 1: Example Model Prompts and Outputs

Its affordable
It states that it is affordable.
It went over the tuition costs.
It clearly stated the prices and fees that will need to be paid.
Its affordable
Just does
They said it has the lowest debt of several colleges so I hope this is affordable for me
It is affordable and not to expensive
It is expensive but has grants and FAFSA information
It lists the credit hour & annual fees
It helps me pay for it on my time
They offer a affordable degrees to get.
The page explained it has affordable classes.
It clearly stated lowest debt rates in America pertaining to getting a degree.
It gave me a taste of cost
It told me about tuition programs.
I told me I would have an affordable education going here.
Low debt
Low cost because online
This page explains the cost of the taking courses online
This page give me hope that I can afford to go back and excel in achieving my dream
It's show me or discuss how I can afford to take classes online
Gives options to make payments.
Fully addressed by showing the cost
It shows that in the website
It clearly addressed the cost per credit.
Financial assistance it says
The cost per credit is very reasonable.
As I mentioned above, cost per credit is low.
The costs were listed and reasonable.
Since they said the cost was a set price it looks like the courses they have available isn't too expensive to learn
They said that of how much per course it cost which is lower that I expected
The cost looks reasonable
And the cost appears to be a very reasonable.
The cost appears to be reasonable.
Good value so not too expensive
Highly ranked for low debt and high value
It explained how it was low cost and affordable
It let me know it wasn't expensive and it worked w state programs.
somewhat met expectations
The costs were given clearly.
I don't know the cost.
I don't know the cost.
It's about average as far as cost per credits
Same again I really don't know what the prices are
Well I need some prices no prices
I didn't see how much it costs
Doesn't shove diversity and inclusion down your throat
It's says low cost and affordable so I would click to see what it would cost
It's great for all
It says on the page that it is affordable.
The fee is quite reasonable
Didn't find price but it says affordable.
There was a comment about being affordable.
Didn't say
It states it has the lowest tuition
It shows that it's an affordable education.
It laid out the ways to afford it.
I would have liked to see some payment options.
Mentions low cost, low debt but no specifics.
The cost was totally stated in a certain area of the site and was quoted as per credit so I could easily decide how many credits I would like to take and add up the cost.
I didn't see amounts
I was nervous in the beginning because I didn't know if this college would
be an affordable option for me to go back to school
It shows cost per credit hour but I didn't see the total costs.
The cost per credit hour is shown but not the credit hours required.
Well it did say that it was affordable and low cost and low debt so that did -continued Example 1: Example Model Prompts and Outputs partially address my concern about it being too expensive but it did not give me the actual cost.
It didn't have enough information I wanted
It is $375 per credit hour.
It is $375 pee Credit hour.
It states it is affordable
The cost per credit showed that it is course based not degree based.
It talked about the price on the main page and I like it
It talked about the price on the main page and I like it
$375 per credit
The cost is not addressed.
Didn't give costs
Not sure I can afford it but it says affordable.
It touched on the fact the grants and scholarships are available and the cost
per unit
It says it's affordable.
This page somewhat discusses university costs.
unmet expectations
I do not see tuition costs.
Im not sure how much it cost
Didn't say
It did not give any pricing for classes.
I did not find the cost of tuition.
This wasn't really mentioned from wjstvibseen
It states $375 per credit, but didn't see anything for poorer people.
Just was not the material to talk about that.
Not enough information
It didn't address if they take credit cards for tuition payment.
I did not see even the cost of a credit hour.
If the price isn't listed, and just says it's affordable, then it's too expensive.
No where does it give the cost of a credit for courses.
Did not list prices
No prices
There were no actual rates or costs posted on this page.
It had no response in what the cost is
Didn't give price just said affordable.
I do not see any prices at all
Summarize this result by describing why respondents felt their expectation was and was not met.
--assistant--
Based on the responses provided by the respondents, it appears that those who had their expectations met felt that the digital experience clearly addressed the cost of tuition and fees, offered affordable degree options, and provided information about financial assistance and payment plans. On the other hand, those who had their expectations somewhat met felt that while the digital experience mentioned low cost and affordability, it did not provide specific information about tuition fees and payment options. Respondents who had their expectations unmet felt that the digital experience did not provide any information about tuition costs and fees, and that it simply mentioned affordability without providing any actual rates or costs. Overall, it seems that providing specific and clear information about tuition costs and payment options is essential to meeting respondents' expectations for affordability in the online higher education industry.
--automation--
Rephrase with as few words as possible. Drop sentences that describe statistics. Do not include a setup sentence and avoid repetition.
--assistant--
Respondents felt their expectation for affordability in online higher education was met when the digital experience provided clear information about tuition fees and payment options, offered affordable degree options, and mentioned financial assistance. When the digital experience only mentioned affordability without providing specific rates or costs, respondents felt their expectations were somewhat met. Respondents felt their expectations were unmet when the digital experience did not provide any information about tuition costs and fees.

Example 1: Example Model Prompts and Outputs

As illustrated above, the automated process begins with the steering message "You are a helpful user experience researcher." The steering message configured the generative language model to take on the perspective of a UX researcher such that the model crafts responses from the point-of-view. As previously noted, the point-of-view configuration may adjust the attention mechanism weights and/or other model parameters that affect the tokens that are output by the model based on learned behavioral patterns of UX researchers.

The next message of the automated process shown in Table 1 includes a summary of the UX test and expectation element. Specifically, the message includes an outcome distribution for a common expectation and a curated set of quotes for the different outcomes. The summary and conditioned result data is combined with the message fragment specifying the task. "Summarize this result by describing why respondents felt their expectation was and was not met." The next element in the dialogue is a finding summary output by the generative language model for the expectation element. In response to receiving the output, the automated process follows up with a third prompt as follows: "Rephrase with as few words as possible. Drop sentences that describe statistics. Do not include a setup sentence and avoid repetition." The subsequent output by the generative language model is then packaged as the finding for the given expectation element.

In some embodiments, findings are crafted by the final "assistant" completion with hyperlinks to the utilized quotes. To create the hyperlinks, the automated process may parse the final output of the generative language model and search for matches between the tokens (words/phrases) in the output and those in the curated set of quotes. The process may create a hyperlink in the finding to a document containing the quote (or a specific location in the document where the quote is found). Another path is to decompose the final output of the model into a summary and referenced quotes, embedding the quotes directly rather than creating hyperlinks. In these examples, the finding may be packages to include a summary, decorated reference quotes, and/or links to utilized quotes. However, the path to a finding is context dependent and may change depending on the type of UX test results and/or previous AI-generated findings that are analyzed.

If any findings result from operation 216, then the findings are persisted for later use in findings database 210. Additionally, the contexts may be updated based on the generated result. An example is the addition of a "test goal" context if the automation has generated at least one "diagnostic & positive" or "diagnostic & negative" finding. A test goal context may interface with the generative language model to generate findings relating to a goal of running the UX test as a function of the one or more previously generated diagnostic findings. Additionally or alternatively, the generated finding results may trigger other types of context updates to create more complex findings. Another example is finding quantitative splits in the UX test results, where quotes may be segmented into "in" groups and "out" groups based on previous quantitative findings, such as described in U.S. application Ser. No. 18/306,030. Such context updates also provide feedback to the system, which may be used to make runtime adjustments to the system to optimize results.

After generating findings for a given context, the process loops back to operation 204, where the next context is fetched and the process proceeds accordingly. This cyclic structure allows the process to perform specific analysis and dynamically populate paths based on collected results. The process may generate findings for each result type and recursively uplevel the findings until the results satisfy a threshold set of parameters.

In some embodiments, the prompts that are generated for a given context may depend on the findings associated with another context. For example, the following sequence may occur:

Quote Set 1 (from test results) in Context A→First set of prompts leading to Finding X1, X2, X3 (based on model output)

Quote Set 2 in Context B→Second set of prompts leading to Finding Y1, Y2 (based on model output)

Quote Set 3 and Finding X1, X2, X3 in Context D→Third set of prompts leading to Finding Z1 (based on model output)

Finding X1, X2, X3, Y1, Y2 in Context E→Fourth set of prompts leading to Finding W1 (based on model output)

The process cycles through all contexts until there are none left. When the process has finished with the contexts, then at operation 212, the process combines the available findings into a draft version of the AI-generated analysis. Thus, the analysis document may include the set of packaged summaries, decorated reference quotes, and/or hyperlinks to utilized quotes across a set of different UX test contexts. Table 2 depicts an example analysis of a webpage created using the techniques above.

TABLE 2

Example AI-generated Analysis

Custom Questions

First, respondents were asked: "If you could change one thing about this web page, what would it be?"
Most respondents felt the experience was fine as is. Others suggested adding more information about outcomes of their education, changing the color palette, reducing the visual complexity, adding content about other degrees, adding some variation to the imagery, and adding cost.
Second, respondents were asked: "Is there anything missing from this web page?" with a follow up of "If yes, please explain."
All respondents said "yes" to missing elements on the webpage. Common and useful responses include the need for a phone number, program and pricing information. Additional feedback included mentioning the imagery wasn't as connected to students-teachers and a desire for content that makes the university stand out. Additional missing elements include graduation rates, job placement rates, and the total time and financial investment required.

Analysis

Respondents felt the experience was easy to understand and navigate, but was not visually appealing and lacked clear, differentiated messaging.
Respondents found the website design and layout easy to navigate and engaging due to its clear sections and use of color and images.
"The sections and color blocking. A readable font, written in an engaging fashion. Provides information clearly. I also appreciate the footnotes related to the statistics." (Diagnostics, Intuitive)
"It uses basic words that are easy to understand and it is easy to navigate." (Diagnostics, Intuitive)
"Everything was laid out clearly and in plain English. The main points that they were trying to get across were repeated, making it easier to remember long term." (Diagnostics, Intuitive)
Most respondents felt their expectation of "Easy to get the information I need (to learn and enroll)" was met, citing the clear and organized layout of the website as helpful.
However, some respondents found the website unengaging due to its lack of visual appeal and interactivity.
"The lack of pictures or colors" (Diagnostics, Engaging)
"Lack of color and interactivity" (Diagnostics, Engaging)
"It's bland and doesn't use different colors for each topic." (Diagnostics, Engaging)
Additionally, some respondents felt like there was too much information and that the content didn't have clear, concise messages.
"The layout of the information on the page. When I first land on the website I'm bombarded by a request information form. All before I know who and what this university is and why I would want to choose them." (Diagnostics, Engaging)

TABLE 2-continued

Example AI-generated Analysis

"It's more like I'm not seeing enough to catch my eye and it's difficult to keep going." (Diagnostics, Intuitive)
"It's all of the writing that would make it less likely to capture my attention" (Diagnostics, Engaging)
Most respondents felt there was a credible path for them at the university, but some left the experience confused by the Education program focus.
Respondents appreciated the variety of programs offered, making it easy for them to imagine finding a program that fits their interests.
"It has a lot of programs that interest me and I can find a program that fits my schedule." (Diagnostics, Valuable)
"It seems like a viable opportunity to learn from home." (Diagnostics, First Impression)
"I feel that it has small online classes that would be affordable to me. I feel I would more likely get hired with a degree from here." (Diagnostics, Valuable)
"The webpage is well-designed and the university appears to have a large selection of degree options." (Diagnostics, Valuable)
Respondents value the affordability and flexibility of online degree programs.
"Shows me that it's possible to go back to school to earn a degree. How affordable it can be" (Diagnostics, Engaging)
"For me it is the offer or promise I should say of affordable authentic higher education." (Diagnostics, Engaging)
"They would be available on my schedule and the education costs are reasonable." (Diagnostics, Valuable)
Respondents found the website inspiring and motivating to further their education.
"It makes me feel like it's something I could do." (Diagnostics, First Impression)
"This says all it needs to say for one to have the desire to click for more information." (Diagnostics, Engaging)
However, some respondents had a hard time connecting to the experience because of the focus on the Education program.
"It appears to be only for educational degrees." (Diagnostics, Valuable)
"I'm not interested in early childhood development as a career." (Diagnostics, Valuable)
"It seems that it offers affordable prices but that's only if you are interested in teaching. What other courses do they offer?" (Diagnostics, First Impression)
Respondents clearly found the offer and institution credible.
Respondents found the university website credible and trustworthy due to its professional presentation and accreditation information.
"The writing at the bottom of the page that talks about why the university is credible" (Diagnostics, Trusted)
"There was like every accreditation and certification listed" (Diagnostics, Trusted)
"It had a section devoted to letting people know that they were credible." (Diagnostics, Engaging)
A few respondents specifically mention the positive perception of the school receiving a national ranking.
"It says it's the best in the nation that makes me more trusting." (Diagnostics, Trusted)

Segments

Women who are open to the idea of enrolling in a college degree program rated the found the experience less trustworthy.
There is clear segmentation of the respondents by expectation and outcome.

Financial

Respondents with unmet or somewhat met "The school is affordable and won't put me in debt" expectations believe the experience is less engaging.
Respondents with met "The school is affordable and won't put me in debt" expectations believe the experience is more engaging.

Program Variety

Respondents with unmet or somewhat met "Find a school a variety of degree programs I am interested in" expectations believe the experience is less intuitive, trustworthy, and valuable.
Respondents with met "Find a school a variety of degree programs I am interested in" expectations believe the experience is more trustworthy and valuable.

In the AI-generated analysis depicted in Table 2, several AI-generated findings are merged together into a single document. As can be seen, the findings identify various aspects of a user experience to improve.

At operation 218, an analyst may curate and supplement the analysis. An analyst may wish to review the AI-generated analysis before providing the results to a customer to ensure the quality of the results. The analyst may remove, add to, or otherwise modify the analysis, including the finding summaries, supporting references, and hyperlinks. Any changes may used as feedback to the AI system to retrain or tune the ML models. For instance, a change in the selected quotes may be fed back into the curation model, which may use a learning algorithm, such as backpropagation, to adjust weights, bias values, and/or other model parameters. The AI-generated analysis may be added to analysis database 222, before the process ends at operation 224.

In some embodiments, analysis database 222 may store a queue of analyses for an analyst to review before presentation to a customer. The AI-generated analysis may significantly increase the work throughput of the analyst and response time between receiving UX test results and providing the customer with insights into their product design. In other embodiments, the AI-generated analysis may be presented directly to the product designer or other end users. The process may create a webpage, application page, and/or other interface that renders the analysis through a browser or client application. The page may include the selectable hyperlinks to the AI-curated quotes that, when selected by the user, direct the user to the location of the quote within the UX test results.

Additionally or alternatively, the AI-generated analysis may be consumed by other applications and processes to trigger other actions directed at optimizing product designs. For example, the first finding in the AI-generated analysis illustrated in Table 2 includes insights into recommended design modifications such as "changing the color palette, reducing the visual complexity, adding content about other degrees, adding some variation to the imagery, and adding cost." As previously noted, the analytics may be mapped to recommended or automatically-implemented actions. In the present example, the AI-generated insights may be mapped to actions such as changing the color palette of the webpage, adding/modifying user interface elements on the webpage to include additional content, or removing user interface elements to reduce clutter. Additionally or alternatively, the insights may be used to decorate or create a prototype for an updated version of the webpage, which may be presented to the webpage designer for review.

4. AUTOMATED ANALYSES USING GENERATIVE LANGUAGE MODELS

In some embodiments, the AI-generated findings and analyses previously described may be incorporated into further downstream AI analytics that compare the product design to other product designs or benchmarks. As previously noted, the AI-generated comparison may be used for one or more of the following:

- Testing and comparing multiple versions of the same experience. For instance, testing multiple designs of a website or other digital experience. Outcomes may include selecting the best candidate experience for further development/release or identifying development options for better candidate user experiences.
- Testing and comparing competitive products. Outcomes may include identifying deficits in a target user experience relative to the competition or characterizing viable solutions in a category.
- Comparing analysis of a portfolio of experiences. Outcomes may include identifying common and consistent positives and negatives.

Figure 3:
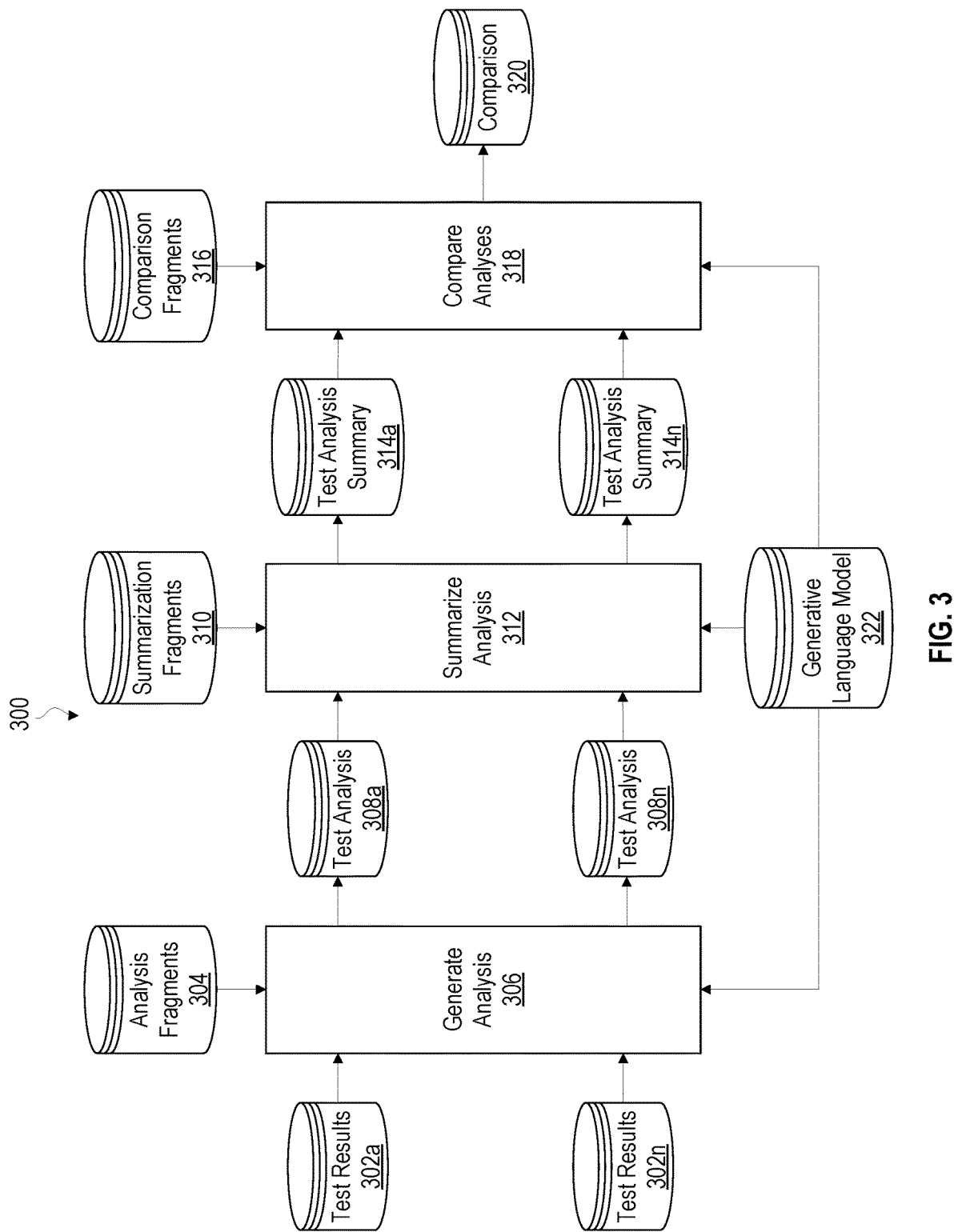
FIG. 3 illustrates a process diagram for performing an automated comparative analyses of a set of user experience tests using a generative language model in accordance with some embodiments.

FIG. 3 illustrates a process diagram for performing an automated comparative analyses of a set of user experience tests using a generative language model in accordance with some embodiments. One or more operations illustrated in FIG. 3 may be modified, rearranged, or omitted all together. Accordingly, the particular sequence of operations illustrated in FIG. 3 should not be construed as limiting the scope of one or more embodiments.

Process 300 receives test results 302*a-n*, which represent two or more sets of results for comparison. The user experience test results be collected from users/respondents for different versions of the same experience (e.g., different designs prototypes for the same product) and/or different experiences (e.g., experiences for a target product and competitor products). As previously noted, the user experience results may include qualitative and/or quantitative data associated with one or more facets of a user's experience.

At operation 306, process 300 interfaces with generative language model 322 to generate an analysis for each of test results 302*a-n*. In some embodiments, each test's results are combined with analysis fragments 304 to perform a dialogue with generative language model 322 and to prompt the model to generate an analysis document for the test. Process 300 may perform the dialogue by constructing dialogue prompts using analysis message content fragments 304, one or more of which may be combined with all or a portion of a set of UX test results 302*a-n*. Example dialogue inputs and outputs to the generative language model are provided in further detail below. In other embodiments, process 300 may execute the process depicted in FIG. 2 for each of test results 302*a-n* to generate the analysis.

The result of applying generative language model 322 at generate analysis operation 206 is test analyses 308*a-n*. The analysis document that is created by generative language model 322 may include detailed insights into the results of each user experience. For example, the analysis document may include summaries of user expectations, diagnostics, heatmaps, responses to custom questions, test goals, quantitative splits, and analytics for other types of test elements as previously discussed. The analysis document may further include supporting test results references with links to the references.

After process 300 has executed operation 306 for each of test results 302*a-n*, the result is n analyses to compare. In other embodiments, operation 306 may be omitted, and generative language model 322 may be applied directly to the user experience test results to generate a summary as discussed further below.

In some embodiments, one or more of test analyses 308*a-n* receives curation and supplementation by an analyst. For example, an analyst may edit/modify or otherwise update the key findings of generative language model 322 with respect to a UX test. Analyst review is not required; however, it may be used to fine-tune generative language model 322 and help make similarities clear during application of generative language model 322 in downstream stages.

Process 300 next combines each analysis (test analyses 308*a-n*) with summarization fragments 310. Summarization fragments 310 may be used to construct dialogue prompts and conduct a dialogue with generative language model 322 at a second stage of the analysis (summarize analysis operation 312). For example, a dialogue prompt may be created that requests the model to generate a bullet point summary of the key findings related to an analysis. Additionally or alternatively other prompts may be generated and submitted to generative language model 322. Additional examples are given below.

In some embodiments, operation 312 is executed to ensure that the comparison stage of the analysis may be performed within the token limits of the generative language model. For example, the dialogue may restrict the summary to a certain number of tokens that are input at the comparison stage. The token limits may vary from one model to the next and may increase over time as generative language models become more advanced. If the token limit exceeds a threshold, then operation 312 may be skipped, letting the entire analysis pass directly to the comparison stage. A benefit of skipping this step is that the details of an analysis are available to the language model. However, a downside is that the act of summarization may help constrain the language model to a more normalized and predictable input, which may help prevent inappropriate inferences.

The result of applying generative language model 322 at operation 312 is test analysis summaries 314a-n. The summaries may include key insights into the results of each user experience. For example, the summary may include a bulleted list of the top n most relevant insights relating to a user experience.

Process 300 next combines each summary (test summaries 314a-n) with content fragments 316. The content fragments may be used to construct dialogue prompts and perform a dialogue with generative language model 322 at a final stage (e.g., $2^{nd}$ or $3^{rd}$ stage in the illustrates process diagram) of the analysis at operation 318. For example, a dialogue prompt may be created requesting the model to compare the key findings of different analyses. The dialogue may prompt the model to identify key strengths and/or weaknesses of a user experience relative to others (e.g., different versions of the same experience or different experiences).

The results of the comparison are packaged and stored in comparison database 320. The results may be used to report the results to a user (e.g., via a GUI), present recommendations to address facets of the user experience experiencing problems (e.g., recommending updates, applications/services that may help enhance experience, etc.), selecting a version of an experience/user interface to use for a given product, and/or to execute other actions.

5. EXAMPLE COMPARISON DIALOGUE

A detailed example is described below for purposes of clarity. Components and/or operations described below should be understood as one specific example which may not be applicable to certain embodiments. Accordingly, components and/or operations described below should not be construed as limiting the scope of any of the claims.

In the example below, the process begins with an analyses of two UX tests. The two tests are for the same experience, but the first targets previous customers and the second targets a more general population of hikers. Table 3 shows the AI-generated analysis conducted for previous customers.

TABLE 3

Example AI-Generated Analysis at First Stage for Previous Customers
As illustrated in Table 3, the analysis includes findings for a variety of contexts, including an overview context, a custom question context, a diagnostic context, and a heatmap for a particular page of the user interface design.

Analysis 1: Previous Shoppers
Overview and Opportunities

The BRAND Product Selection Journey-Previous Shoppers (1) experience is highly effective for those considering purchasing new hiking shoes.
Respondents find the PRODUCT specifications and features high-quality and worth the offered price.
The hero image and other product visuals engage potential customers by providing multiple angles and views of the boot in action.
Visitors appreciate that the experience features customer reviews as they rely on them for relevant feedback before making a purchase.
Viewers are disappointed that the PRODUCT A shoe is not eligible for discounts or promotions, despite information on sales and promotions being displayed at the top of the page.

Custom Questions

Alongside the traditional WEVO questionnaire, potential customers were asked several custom questions to evaluate their comprehension and perception of the experience.
First, visitors were asked: "How would you rate yourself as a hiker?"
50% of respondents consider themselves to be mid-level hikers who primarily rely on occasional recreational hikes for their level of expertise, while 32% identify as experienced hikers. (Custom Question #1, Hiker Rating?)
Visitors largely perceive the BRAND brand in a positive light and describe its products as rugged, stylish, durable, high-quality, and comfortable.
"Professional, durable, trendy, and moderate hiking boots that will support your hiking trip. It's classic yet modern." (Custom Question #2)
Next, visitors were asked to describe the most helpful or informative aspects of the PRODUCT A page.
Respondents primarily indicate the features section of the page as most helpful during the purchasing process as it offers valuable insight into relevant features.
"The features succinctly describe all I would want to know about the shoe." (Custom Question #3)
"The features of the shoe are well presented, informative, and impressive." (Custom Question #3)
A combined 97% of respondents either agree or strongly agree with the statement: "I understood the shoe's specifications and features," further showcasing the clarity of and value TABLE 3-continued Example AI-Generated Analysis at First Stage for Previous Customers
As illustrated in Table 3, the analysis includes findings for a variety of contexts, including an overview context, a custom question context, a diagnostic context, and a heatmap for a particular page of the user interface design.

that users place on the features and specifications sections.
Other areas that respondents perceive as helpful and informative include the sizing chart, the specifications in regards to trail type and weight, and the customer reviews section.
Among the top features of the shoe that stood out, respondents highly valued its durability (52%), comfort (52%), traction (41%), and supported ankle stability (41%).

Customer Experience

The experience is easily navigable and highlights valuable information regarding the product's style and specifications.
The product selection journey is well-organized, with a straightforward layout that guides the user to pertinent information such as the shoe's specifications and customer reviews.
"The page gave detail on the shoe and its use, it also had information on availability and there are user reviews to see how the shoe performs in the real world." (Diagnostics, Intuitive)
"The page had a lot of information. This included a great description of the shoes, their benefits, and qualities. The shoes look rugged and great for outdoors." (Diagnostics, First Impression)
The product imagery within the journey is useful in demonstrating how the shoes are worn when hiking as well as their unique style.
"There are a ton of images to go through that are detailed and helpful so I would for sure feel engaged while going through the site while shopping." (Diagnostics, Engaging)
"The photos of the boot are everywhere and show it well. All of the information I would initially seek was right there in front of me." (Diagnostics, Engaging)

Relevance and Trust

Quality and durability are top of mind, and of the group that mentions hoping to find a premium product that will last a long time, 78% indicate that the experience fully meets their expectations.
Potential customers highly value the shoe's durability and user reviews provide further reassurance to those considering purchasing the item.
"The description gives a lot of info about features and benefits of the shoe. The design is said to be fitted well and very durable." (Diagnostics, Valuable)
"The reviews are super detailed and transparent so based on all the information given I would definitely feel confident in purchasing these and finding the pair that would fit me best." (Diagnostics, Valuable)
Visitors appreciate that the price of the product is clearly stated and accessible, 67% of respondents who initially expressed their hope for a reasonably priced pair of shoes disclose that their expectations are fully met by the experience.
"Based on all the information provided throughout the website and what these shoes offer-the prices definitely seem fair and worth it." (Expectations, They are reasonably priced)
The experience also adequately addresses customer concerns regarding the comfort of the shoes, 70% of respondents with the expectation that these shoes will be comfortable to wear find their expectation fully met by the site.
"I trust that the reviews are accurate, trustworthy and genuine and I get the impression that the shoes are pretty comfortable for all types of needs and wants." (Expectations, Comfortable to wear)

Page 1: PRODUCT A

The first image of the shoe is a focal point of the page, visitors voice positive sentiments over its style and the subsequent angles from which the product can be viewed.
Visitors share:
"I like that it's a very clear photo of what the shoe looks like." (Sentiment Map, Likes)
"I like all the clear, high resolution, quality photos and images of the shoes." (Sentiment Map, Likes)
A small cohort of potential customers appreciate the ability to purchase shoes which are wider in size.
"I have wide feet so this option is nice especially if you are going to be wearing thicker socks." (Sentiment Map, Likes)
A few visitors praise the presence of customer review as they rely on this information to determine whether to move forward with a purchase.
"Reviews are so important to me. The description of the shoe may sound great but I want real peoples honest opinions on it" (Sentiment Map, Likes)
"I definitely like to see what other people think about the shoes before I spend so much money." (Sentiment Map, Likes)
However, a group of respondents question the value of the promotion mentioned in the header and are not interested in buying multiple pairs of shoes to receive a discount.
Additionally, potential customers are confused and disappointed that this style of shoe is excluded from promotions and discounts, especially since information about discounts is displayed prominently at the top of the page.
"Promotions are at the top of the page, and you have to page way down to see that the item we are looking at is excluded from promotions. This is a bit like bait and switch tactics." (Sentiment Map, Dislikes)
"The shoe is disqualified from promotions, however the customer is bombarded with discounts when first navigating the page." (Sentiment Map, Dislikes)

TABLE 3-continued

Example AI-Generated Analysis at First Stage for Previous Customers
As illustrated in Table 3, the analysis includes findings for a variety of contexts, including an overview context, a custom question context, a diagnostic context, and a heatmap for a particular page of the user interface design.

Some visitors feel confused about whether the shoes are waterproof. While information in the user review section suggests that they are not waterproof, a few respondents assume that this type of shoe is waterproof, creating a friction point in the experience.
"It needs to emphasize whether the product is waterproof or not." (Sentiment Maps, Dislikes)
"I would think that this type of shoe would waterproof or at least water resistant." (Sentiment Maps, Dislikes)
Insights by ANALYST A Table 4 illustrates the AI generated for the same experience targeting users identified as hikers.

TABLE 4

Example AI-Generated Analysis at First Stage for Previous Customers
As illustrated in Table 4, the AI-generated analysis for hikers includes several distinct insights compared to the previous customer analysis.

Analysis 2: Hikers
Overview and Opportunities

The BRAND PRODUCT A product journey has some room for improvement to provide an optimal experience for customers looking to purchase hiking shoes.
While visitors find the page is well-designed and includes information they expect to find regarding hiking shoes, the journey does not stand out as an experience distinct from other shoe websites.
Visitors appreciated the quality and reputation of BRAND shoes, however, some are disappointed that features or options that they are looking for are not available.
Affordability and style play a part in some users' disengagement, with some pricing out of range, while others do not find a style of shoe that appeals to them.
Custom Questions In addition to the standard WEVO diagnostic measures, visitors to the page were asked some custom questions about their experience.
When asked: "How would you rate yourself as a hiker?" most answered mid-level (48%) or experienced (32%), with 8% indicating they are beginners.
Most describe their rating in the context of how long they've been hiking, how often they hike, the difficulty of their hikes, and their love of hiking, with a few describing limitations based on age or previous injuries:
"We go on a lot of hikes on our local trails, I'm a little limited because of physical abilities so I don't do as difficult as some people but the ones we hike, we hike often." (Custom Question 1, mid-level)
"I've been hiking since the 1970s and I've explored and hiked many of our State Parks and Nature Preserves, our National Parks and National Forests but I am getting old now and my hikes are shorter." (Custom Question 1, experienced)
When asked, "What characteristics would you use to describe BRAND?" most visitors describe the brand as high-quality, durable, comfortable, and reliable, with a few comments that describe the brand as good-looking or highlight the eco-friendly aspects of the products:
"Sturdy enough to handle most hiking , but light enough to make you comfortable for longer trails. They are also cushiony, Comfortable and lets your feet breathe." (Custom Question 2)
When asked "What area of this page was most helpful or informative?" respondents point to the bulleted product features description, as well as the 'made for'/'trail type'/'weight' section, and customer reviews:
"I like this area because it clearly states that the shoe is made for hiking and I appreciate that you make it very clear that I am looking at and purchasing the correct item from your site." (Custom Question 3)
"The feature section provided vital information regarding the hiking shoes." (Custom Question 3)
Visitors were also asked: "Do you agree or disagree: I understood the shoe's specifications and features."
Most users agree (46%) or strongly agree (46%), and indicate that the information about specifications is easy to understand and provides the details they need regarding weight, construction, and quality, with a few users being slightly confused about the benefit of some listed features:
"All the benefits of each feature was pretty much explained, one thing that I didn't see a reason for was nylon arch shank. I don't know what that is or why it's beneficial, but it sounds fancy so I trust that it's a good thing to have." (Custom Question 4, agree)
"I understood what each of the shoe's features and specifications are and what the purpose of them are." (Custom Question 4, strongly agree)

TABLE 4-continued

Example AI-Generated Analysis at First Stage for Previous Customers
As illustrated in Table 4, the AI-generated analysis for hikers includes several distinct insights compared to the previous customer analysis.

When asked, "Which of the following features on the PRODUCT A stands out to you the most?" the top 3 features are durability (60%), comfort (55%), and supported ankle stability (41%):
"Stability, comfort and durability are three majorly important factors to look for when purchasing most things you wear but especially a shoe made for hiking." (Custom Question 5)
"They will last a long time because they are durable, and they provide extra ankle support and cushioning to make them comfortable and sturdy." (Custom Question 5)
Customer Experience Menus are clear and easy to follow, the page layout is clear, and the information is organized in a way that helps visitors easily find the information they care about and expect to see: durability/quality, comfort, pricing/affordability, and sizing.
Visitors share:
"I was able to easily navigate the page to find the info I was looking for about the shoe" (Diagnostic, Intuitive)
"The layout of the information is well categorized. The video help illustrate the benefits. The site is easy to navigate." (Diagnostic, Intuitive)
The large, colorful pictures on the product selection journey, including shots of hikers showing the product "in action" are appealing to visitors and help engage them with the page:
"I liked the images of people hiking, I also liked seeing the specs of the shoes the durability was exactly what I said I wanted." (Diagnostic, First Impression)
"How the product is displayed in use. Also specific aspects of the design are accompanied by high quality close-up images for a thorough detailed experience." (Diagnostic, Engaging)
While well-designed and appealing, the experience also strikes some users as overwhelming, containing too much information:
"It was easy to navigate and to find the benefits of these shoes. The page was a bit busy though." (Diagnostic, First Impression)
"There is a lot going on on the page, making it somewhat hard to navigate." (Diagnostic, Intuitive)
Users find the page layout familiar, but for some it does not do enough to differentiate itself from other shoe websites:
"The page was simply the typical online shopping experience with nothing particularly attention grabbing" (Diagnostic, Engaging)
"There's nothing new or fancy I'd like to see some better options" (Diagnostic, Engaging)
Relevance and Value Comfort and durability (high quality/long-lasting) are the top expectations visitors express that they are looking for in hiking shoes, and 72% of visitors that expressed those expectations find them met by their experience with the page.
Visitors share:
"The features like says they're are made of real suede which I know what's a long time and there is extra reinforcement on heels and toes. Reviews mentioned they last a long time also." (Expectations, durability)
Visitors remark that the price given the quality and reputation of BRAND shoes provides value, though a few find them out of their price range despite discounts:
"I liked how they looked first, and found a color for me. But the more important info came next, about how the shoe was made to be comfortable & protective. I know the name BRAND makes good shoes. And the price was reasonable." (Diagnostic, Valuable)
"Through the product description and what it offers people like me. I now know these are quality materials engineered by professionals, and are worth the price: I can get a lot of use out of these." (Expectation, Reasonably Priced)
Relevant features, particularly waterproofing information is of particular concern to visitors, and it is unclear whether shoes are waterproof:
"Lots of people were complaining that the shoe isn't waterproof. I am from Florida and this would be a no-go." (Diagnostic, First Impression)
Style and appearance are a mixed bag, with some visitors commenting on the appearance and color options as a positive, while others find the color options limited and the styles fairly ordinary.
Trust BRAND's reputation as a quality brand is a key element that inspires trust in the products. Reviews not only highlight BRAND's quality, but also can influence visitors' positive perceptions of BRAND's customer service:
"They allowed people to return them for not being waterproof which is generous" (Diagnostic, Trusted)
"The detailed features and the high reviews. There are also some reviews that are a little more negative and the brand responds to the review so it seems like they aren't being selective with what they let you see and they care about customer support." (Diagnostic, Trusted)

TABLE 4-continued

Example AI-Generated Analysis at First Stage for Previous Customers
As illustrated in Table 4, the AI-generated analysis for hikers includes several distinct insights compared to the previous customer analysis.

Visitors' personal experiences with the BRAND brand help lend trustworthiness to their impression of BRAND's products:
"I have owned many pairs of these shoes and know the quality of their products" (Diagnostic, Trusted)
"The last pair of BRAND I owned lasted me over 3 years with pretty regular use" (Diagnostic, Trusted)
Page 1: BRAND PRODUCT A The hero image provides large, clear images of the shoes from multiple views, angles, and colors, engaging visitors and allowing them to get a good feel for the product appearance:
"The photo of the shoe itself is clear and eye catching." (Sentiment Map, Likes)
Prominent placement of shoe vital statistics such as type, weight, and key features are appreciated by visitors who usually need to search for this information:
"It has the details I want to know but usually have to search for" (Sentiment Map, Likes) Visitors find the "action shots" of hikers engaging and likable.
The bulleted list of product features provides comprehensive details that visitors are looking for before purchasing:
"I love seeing the features all laid out so I know that this shoe is going to give me the comfort and durability I want." (Sentiment Map, Likes)
"I want to know as much about the shoes that I'm interested in purchasing" (Sentiment Map, Likes)
Visitors appreciate having reviews, but react negatively to those which reference a lack of waterproofing. Areas of the page that deal with pricing or the fact that the PRODUCT A is excluded from discount pricing are met with some dislike, though a few visitors recognize the value of BRAND shoes and do not feel it is a complete deal-breaker:
"Oh the higher end of a price for a legitimate hiking shoe. But not a deterrent" (Sentiment Map, Dislike)
"The price is a little steep but if the quality is there it is well worth it" (Sentiment Map, Dislike)
"Why have promotional material as soon as you load the site, just to tell potential customers that this product is excluded from sales?" (Sentiment Map, Dislike)
Insights by ANALYST B The analyses illustrated in Table 3 and 4 may then be passed to a summarizer to have a preconceived dialogue with a language model. The details for the first summarization are presented below. Here, {{Analysis 1}} refers to Analysis in Example 1 above, which is injected at this position. Additionally—system—and—assistant—proceed algorithm and generative language model messages respectively. That is, —system—represents the dialogue crafted by the automated process interfacing with generative language model 322, and -assistant—represents the responses of the model. The example in Table 5 below is composed of paths to—system—messages and—assistant—messages, which are included to give a complete picture of the dialogue's execution.

TABLE 5

Model Prompts and Outputs at Second Stage

-- system --
{{Analysis1}} ###
Summarize as a bulleted list of complete sentences.
-- assistant --
-The BRAND Product Selection Journey is highly effective for potential customers considering purchasing new hiking shoes, with respondents finding the boots' specifications and features high-quality and worth the offered price.
-The hero image and other product visuals engage potential customers by providing multiple angles and views of the boot in action.
-Visitors appreciate the inclusion of customer reviews, as they rely on them for relevant feedback before making a purchase.
-However, viewers are disappointed that PRODUCT A is not eligible for discounts or promotions, despite information on sales and promotions being displayed at the top of the page.
-Custom questions reveal that 50% of respondents consider themselves mid-level hikers, while 32% identify as experienced hikers.
-Visitors perceive the BRAND brand positively, describing its products as rugged, stylish, durable, high-quality, and comfortable.
-The features section of the page is most helpful during the purchasing process, as it offers valuable insight into relevant features.
-A combined 97% of respondents either agree or strongly agree with the statement: "I understood the shoe's specifications and features."
-The experience is easily navigable, well-organized, and includes useful product imagery.
-Quality and durability are top of mind, with 78% of respondents indicating that the experience fully meets their expectations for a premium product that will last a long time.
-The price of the product is clearly stated and accessible, with 67% of respondents finding the price reasonable.

TABLE 5-continued

Model Prompts and Outputs at Second Stage

-70% of respondents find their expectations for comfort met by the site.
-Some visitors feel confused about whether the shoes are waterproof, creating a friction point in the experience.

If {{Summary 1}} and {{Summary 2}} represent the generative model's summary, then the system may use a collection of comparison message content fragments to perform the comparison as follows. The cited scores are pulled from the respective test results and are included to ensure that the generative model can properly determine best-worst and intermediates.

TABLE 6

Model Prompts and Outputs at Third Stage

-- system --
Key Findings for 'BRAND Product Selection Journey - Previous Shoppers'
Score: 91
{{Summary 1}}

Key Findings for 'BRAND Product Selection Journey - Hikers'
Score: 78
{{Summary 2}}

Comparison Specification
- How did the experiences compare? Which was most and least effective? Why?
- How does the most effective experience differentiate itself? (can be multiple bullets/examples)
- What are the common issues or successes?
- What are the experience specific issues or successes?
- Are there any notable common or experience specific pain points?

Create a Comparison document. Do not cite statistics.
-- assistant --
Comparison of BRAND Product Selection Journey - Previous Shoppers vs. Hikers
How did the experiences compare? Which was most and least effective? Why?
The experiences for both Previous Shoppers and Hikers were overall positive, with Previous Shoppers scoring the experience higher. The Previous Shoppers' experience was more effective due to their familiarity with the brand and its products, while Hikers found the website similar to other shoe websites and desired more features.
How does the most effective experience differentiate itself? (can be multiple bullets/examples) 
-Previous Shoppers appreciated the product visuals and hero image, finding them engaging and informative.
-The features section was found to be helpful for Previous Shoppers, offering valuable insight into the product.
-Previous Shoppers were more accepting of the product pricing, with 67% finding it reasonable.
**What are the common issues or successes?*
- Both groups found the website navigable, well-organized, and appreciated the useful product imagery.
- Customer reviews were important to both groups, inspiring trust in the products and customer service.
- Both groups found confusion surrounding the waterproofing information, indicating a need for clarity.
What are the experience specific issues or successes?
- Previous Shoppers were disappointed with the exclusion of the product from discounts or promotions.
- Hikers desired more color options and unique styles, as well as more features and options for customization.
- Hikers had mixed reactions to pricing and exclusion from discounts, with some recognizing the value despite the higher cost.
Are there any notable common or experience specific pain points?
- A common pain point for both groups is the confusion surrounding waterproofing information, which could be addressed by making this information clearer on the product page.
- An experience-specific pain point for Previous Shoppers is the disappointment with the exclusion of the product from discounts and promotions.
- A pain point for Hikers is the desire for more color options, unique styles, and additional features or customization options.
-- system --
Rework the comparison to observe the following style.
- Create a bulleted list of sentences.

TABLE 6-continued

Model Prompts and Outputs at Third Stage

- Drop redundant content.
- Drop non-informative content.
- Make sure to mention common positive and negative aspects with sentiment retained.
- Do not make recommendations.
- Do not use personal pronouns.
- Use the present tense.
Speak in the voice of a researcher describing to their customer what should be taken away
from the comparison.
-- assistant --
- Previous Shoppers score the BRAND Product Selection Journey higher than Hikers,
indicating higher effectiveness for this group.
- Both groups appreciate engaging product visuals, hero image, and the well-organized layout
of the website.
- The features section is helpful for Previous Shoppers, providing valuable insight into the
product.
- Customer reviews play a crucial role in building trust for both Previous Shoppers and Hikers.
- Confusion regarding waterproofing information is a common issue for both groups.
- Previous Shoppers show disappointment with the exclusion of the product from discounts or
promotions.
- Hikers express a desire for more color options, unique styles, and additional features or
customization options.
- Mixed reactions to pricing and exclusion from discounts are observed among Hikers, with
some recognizing the value despite the higher cost.
-- user --
Rework to adhere to the following order.
    1. Cover the best and worst experience. Make sure to mention why.
    2. Cover the common elements.
    3. Cover only the most notable exemplars.
Make sure the result is a bulleted list without organizational headers.
-- assistant --
- Previous Shoppers experience the most effective BRAND Product Selection Journey, likely
due to their familiarity with the brand and its products.
- Hikers find the experience less effective, as they desire more features and perceive the
website as similar to other shoe websites.
- Both groups appreciate engaging product visuals, hero image, well-organized layout, and the
importance of customer reviews.
- Confusion regarding waterproofing information is a common issue for both Previous
Shoppers and Hikers.
- The features section is particularly helpful for Previous Shoppers, providing valuable product
insight.
- Previous Shoppers show disappointment with the exclusion of the product from discounts or
promotions.
- Hikers express a desire for more color options, unique styles, and additional features or
customization options.

In the example illustrated in Table 6 above, the same experience is compared with respect to users/respondents grouped using different attributes (i.e., previous shoppers vs. hikers). However, as previously noted, the systems and techniques described above may be applied to an arbitrary number of analyses. For example, the analysis may compare hikers' experiences with one product to hikers' experiences with competitive products and/or hikers' experiences with different user interfaces for the same product. Additionally or alternatively, the comparative analysis may group users based on any other attribute or combination of attributes, which may be curated by a user and/or automatically detected (e.g., based on statistical relevance to quantitative test results data).

Also, as illustrated above, various prompts are created and submitted to the generative language model to generate the final comparison result set. In some cases, the prompts may be submitted in a predefined order. In other embodiments, the prompts may be generated dynamically based on feedback/model output. For instance, the prompts "Make sure the result is a bulleted list without organizational headers" may be generated responsive to detecting that the output is not in a bulleted list form and/or includes an organizational header but be omitted otherwise. Similarly, the process may parse the dialogue outputs of the model and determine which prompts to submit next dynamically.

In some embodiments, the AI-generated comparison data may trigger one or more automated actions. For example, the comparison data may be used to select between different versions of a website to launch live based on which version satisfied performance goals with respect to a group of test respondents. As another example, the data may be used to merge different versions of a website, selecting user interface components that yielded more positive insights. In yet another example, the AI-generated comparison data may be used to dynamically select between different versions of a website for different visitors to the website based on one or more user attributes. For instance, if the server detects, based on user attributes extracted through HTTP cookies or survey questions, that the user is a hiker, then one version of the website may be rendered on the visitor's browser. Otherwise, the server may select and render a different version of the website. Additionally or alternatively, the comparison data may be used to decorate, annotate, and/or otherwise highlight different aspects of a prototype that performed comparatively well and/or poorly with respect different versions of the same user experience or competing user experiences. Thus, the comparison data may drive design decisions and actions to optimize user experiences.

6. COMPUTER NETWORKS AND CLOUD NETWORKS

In some embodiments, a computer network provides connectivity among a set of nodes. The nodes may be local to and/or remote from each other. The nodes are connected by a set of links. Examples of links include a coaxial cable, an unshielded twisted cable, a copper cable, an optical fiber, and a virtual link.

A subset of nodes implements the computer network. Examples of such nodes include a switch, a router, a firewall, and a network address translator (NAT). Another subset of nodes uses the computer network. Such nodes (also referred to as "hosts") may execute a client process and/or a server process. A client process makes a request for a computing service (such as, execution of a particular application, and/or storage of a particular amount of data). A server process responds by executing the requested service and/or returning corresponding data.

A computer network may be a physical network, including physical nodes connected by physical links. A physical node is any digital device. A physical node may be a function-specific hardware device, such as a hardware switch, a hardware router, a hardware firewall, and a hardware NAT. Additionally or alternatively, a physical node may be a generic machine that is configured to execute various virtual machines and/or applications performing respective functions. A physical link is a physical medium connecting two or more physical nodes. Examples of links include a coaxial cable, an unshielded twisted cable, a copper cable, and an optical fiber.

A computer network may be an overlay network. An overlay network is a logical network implemented on top of another network (such as, a physical network). Each node in an overlay network corresponds to a respective node in the underlying network. Hence, each node in an overlay network is associated with both an overlay address (to address to the overlay node) and an underlay address (to address the underlay node that implements the overlay node). An overlay node may be a digital device and/or a software process (such as, a virtual machine, an application instance, or a thread) A link that connects overlay nodes is implemented as a tunnel through the underlying network. The overlay nodes at either end of the tunnel treat the underlying multi-hop path between them as a single logical link. Tunneling is performed through encapsulation and decapsulation.

In some embodiments, a client may be local to and/or remote from a computer network. The client may access the computer network over other computer networks, such as a private network or the Internet. The client may communicate requests to the computer network using a communications protocol, such as Hypertext Transfer Protocol (HTTP). The requests are communicated through an interface, such as a client interface (such as a web browser), a program interface, or an API.

In some embodiments, a computer network provides connectivity between clients and network resources. Network resources include hardware and/or software configured to execute server processes. Examples of network resources include a processor, a data storage, a virtual machine, a container, and/or a software application. Network resources are shared amongst multiple clients. Clients request computing services from a computer network independently of each other. Network resources are dynamically assigned to the requests and/or clients on an on-demand basis. Network resources assigned to each request and/or client may be scaled up or down based on, for example, (a) the computing services requested by a particular client, (b) the aggregated computing services requested by a particular tenant, and/or (c) the aggregated computing services requested of the computer network. Such a computer network may be referred to as a "cloud network."

In some embodiments, a service provider provides a cloud network to one or more end users. Various service models may be implemented by the cloud network, including but not limited to Software-as-a-Service (SaaS), Platform-as-a-Service (PaaS), and Infrastructure-as-a-Service (IaaS). In SaaS, a service provider provides end users the capability to use the service provider's applications, which are executing on the network resources. In PaaS, the service provider provides end users the capability to deploy custom applications onto the network resources. The custom applications may be created using programming languages, libraries, services, and tools supported by the service provider. In IaaS, the service provider provides end users the capability to provision processing, storage, networks, and other fundamental computing resources provided by the network resources. Any arbitrary applications, including an operating system, may be deployed on the network resources.

In some embodiments, various deployment models may be implemented by a computer network, including but not limited to a private cloud, a public cloud, and a hybrid cloud. In a private cloud, network resources are provisioned for exclusive use by a particular group of one or more entities (the term "entity" as used herein refers to a corporation, organization, person, or other entity). The network resources may be local to and/or remote from the premises of the particular group of entities. In a public cloud, cloud resources are provisioned for multiple entities that are independent from each other (also referred to as "tenants" or "customers"). The computer network and the network resources thereof are accessed by clients corresponding to different tenants. Such a computer network may be referred to as a "multi-tenant computer network." Several tenants may use a same particular network resource at different times and/or at the same time. The network resources may be local to and/or remote from the premises of the tenants. In a hybrid cloud, a computer network comprises a private cloud and a public cloud. An interface between the private cloud and the public cloud allows for data and application portability. Data stored at the private cloud and data stored at the public cloud may be exchanged through the interface. Applications implemented at the private cloud and applications implemented at the public cloud may have dependencies on each other. A call from an application at the private cloud to an application at the public cloud (and vice versa) may be executed through the interface.

In some embodiments, tenants of a multi-tenant computer network are independent of each other. For example, a business or operation of one tenant may be separate from a business or operation of another tenant. Different tenants may demand different network requirements for the computer network. Examples of network requirements include processing speed, amount of data storage, security requirements, performance requirements, throughput requirements, latency requirements, resiliency requirements, Quality of Service (QOS) requirements, tenant isolation, and/or consistency. The same computer network may need to implement different network requirements demanded by different tenants.

In some embodiments, in a multi-tenant computer network, tenant isolation is implemented to ensure that the applications and/or data of different tenants are not shared with each other. Various tenant isolation approaches may be used.

In some embodiments, each tenant is associated with a tenant ID. Each network resource of the multi-tenant computer network is tagged with a tenant ID. A tenant is permitted access to a particular network resource only if the tenant and the particular network resources are associated with a same tenant ID.

In some embodiments, each tenant is associated with a tenant ID. Each application, implemented by the computer network, is tagged with a tenant ID. Additionally or alternatively, each data structure and/or dataset, stored by the computer network, is tagged with a tenant ID. A tenant is permitted access to a particular application, data structure, and/or dataset only if the tenant and the particular application, data structure, and/or dataset are associated with a same tenant ID.

As an example, each database implemented by a multi-tenant computer network may be tagged with a tenant ID. Only a tenant associated with the corresponding tenant ID may access data of a particular database. As another example, each entry in a database implemented by a multi-tenant computer network may be tagged with a tenant ID. Only a tenant associated with the corresponding tenant ID may access data of a particular entry. However, the database may be shared by multiple tenants.

In some embodiments, a subscription list indicates which tenants have authorization to access which applications. For each application, a list of tenant IDs of tenants authorized to access the application is stored. A tenant is permitted access to a particular application only if the tenant ID of the tenant is included in the subscription list corresponding to the particular application.

In some embodiments, network resources (such as digital devices, virtual machines, application instances, and threads) corresponding to different tenants are isolated to tenant-specific overlay networks maintained by the multi-tenant computer network. As an example, packets from any source device in a tenant overlay network may only be transmitted to other devices within the same tenant overlay network. Encapsulation tunnels are used to prohibit any transmissions from a source device on a tenant overlay network to devices in other tenant overlay networks. Specifically, the packets, received from the source device, are encapsulated within an outer packet. The outer packet is transmitted from a first encapsulation tunnel endpoint (in communication with the source device in the tenant overlay network) to a second encapsulation tunnel endpoint (in communication with the destination device in the tenant overlay network). The second encapsulation tunnel endpoint decapsulates the outer packet to obtain the original packet transmitted by the source device. The original packet is transmitted from the second encapsulation tunnel endpoint to the destination device in the same particular overlay network.

7. MICROSERVICE APPLICATIONS

According to some embodiments, the techniques described herein are implemented in a microservice architecture. A microservice in this context refers to software logic designed to be independently deployable, having endpoints that may be logically coupled to other microservices to build a variety of applications. Applications built using microservices are distinct from monolithic applications, which are designed as a single fixed unit and generally comprise a single logical executable. With microservice applications, different microservices are independently deployable as separate executables. Microservices may communicate using Hypertext Transfer Protocol (HTTP) messages and/or according to other communication protocols via API endpoints. Microservices may be managed and updated separately, written in different languages, and be executed independently from other microservices.

Microservices provide flexibility in managing and building applications. Different applications may be built by connecting different sets of microservices without changing the source code of the microservices. Thus, the microservices act as logical building blocks that may be arranged in a variety of ways to build different applications. Microservices may provide monitoring services that notify a microservices manager (such as If-This-Then-That (IFTTT), Zapier, or Oracle Self-Service Automation (OSSA)) when trigger events from a set of trigger events exposed to the microservices manager occur. Microservices exposed for an application may alternatively or additionally provide action services that perform an action in the application (controllable and configurable via the microservices manager by passing in values, connecting the actions to other triggers and/or data passed along from other actions in the microservices manager) based on data received from the microservices manager. The microservice triggers and/or actions may be chained together to form recipes of actions that occur in optionally different applications that are otherwise unaware of or have no control or dependency on each other. These managed applications may be authenticated or plugged in to the microservices manager, for example, with user-supplied application credentials to the manager, without requiring reauthentication each time the managed application is used alone or in combination with other applications.

In some embodiments, microservices may be connected via a GUI. For example, microservices may be displayed as logical blocks within a window, frame, other element of a GUI. A user may drag and drop microservices into an area of the GUI used to build an application. The user may connect the output of one microservice into the input of another microservice using directed arrows or any other GUI element. The application builder may run verification tests to confirm that the output and inputs are compatible (e.g., by checking the datatypes, size restrictions, etc.)

Triggers

The techniques described above may be encapsulated into a microservice, according to some embodiments. In other words, a microservice may trigger a notification (into the microservices manager for optional use by other plugged in applications, herein referred to as the "target" microservice) based on the above techniques and/or may be represented as a GUI block and connected to one or more other microservices. The trigger condition may include absolute or relative thresholds for values, and/or absolute or relative thresholds for the amount or duration of data to analyze, such that the trigger to the microservices manager occurs whenever a plugged-in microservice application detects that a threshold is crossed. For example, a user may request a trigger into the microservices manager when the microservice application detects a value has crossed a triggering threshold.

In one embodiment, the trigger, when satisfied, might output data for consumption by the target microservice. In another embodiment, the trigger, when satisfied, outputs a binary value indicating the trigger has been satisfied, or outputs the name of the field or other context information for which the trigger condition was satisfied. Additionally or alternatively, the target microservice may be connected to one or more other microservices such that an alert is input to the other microservices. Other microservices may perform responsive actions based on the above techniques, including, but not limited to, deploying additional resources, adjusting system configurations, and/or generating GUIs. Actions In some embodiments, a plugged-in microservice application may expose actions to the microservices manager. The exposed actions may receive, as input, data or an identification of a data object or location of data, that causes data to be moved into a data cloud.

In some embodiments, the exposed actions may receive, as input, a request to increase or decrease existing alert thresholds. The input might identify existing in-application alert thresholds and whether to increase or decrease, or delete the threshold. Additionally or alternatively, the input might request the microservice application to create new in-application alert thresholds. The in-application alerts may trigger alerts to the user while logged into the application, or may trigger alerts to the user using default or user-selected alert mechanisms available within the microservice application itself, rather than through other applications plugged into the microservices manager.

In some embodiments, the microservice application may generate and provide an output based on input that identifies, locates, or provides historical data, and defines the extent or scope of the requested output. The action, when triggered, causes the microservice application to provide, store, or display the output, for example, as a data model or as aggregate data that describes a data model.

8. HARDWARE OVERVIEW

According to one embodiment, the techniques described herein are implemented by one or more special-purpose computing devices. The special-purpose computing devices may be hard-wired to perform the techniques, or may include digital electronic devices such as one or more application-specific integrated circuits (ASICs), field programmable gate arrays (FPGAs), or network processing units (NPUs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 4 illustrates a computer system in accordance with some embodiments. Computer system 400 includes a bus 402 or other communication mechanism for communicating information, and a hardware processor 404 coupled with bus 402 for processing information. Hardware processor 404 may be, for example, a general-purpose microprocessor.

Computer system 400 also includes a main memory 406, such as a random-access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk or optical disk, is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 410. Volatile media includes dynamic memory, such as main memory 406. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the worldwide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

9. MISCELLANEOUS; EXTENSIONS

Embodiments are directed to a system with one or more devices that include a hardware processor and that are configured to perform any of the operations described herein and/or recited in any of the claims below.

In some embodiments, a non-transitory computer readable storage medium comprises instructions which, when executed by one or more hardware processors, causes performance of any of the operations described herein and/or recited in any of the claims. Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method comprising:
generating, by a process based at least in part on a first set of message fragments and a plurality of user experience test result sets, a first set of automated prompts for a generative language model to generate an analysis for each user experience test result set of the plurality of user experience test result sets;
providing, by the process, the first set of automated prompts as input to the generative language model, wherein the generative language model applies at least one of a recurrent neural network or a transformer model to the first set of automated prompts;
generating, by the process based at least in part on a second set of message fragments and the analysis for each user experience test result set of the plurality of user experience test result sets, a second set of automated prompts for the generative language model to compare at least part of different analyses for the plurality of user experience test result sets;
providing, by the process, the first set of automated prompts as input to the generative language model, wherein the generative language model applies at least one of the recurrent neural network or the transformer model to the second set of automated prompts; and
presenting, within a user interface based on at least one response received from the generative language model to the second set of automated prompts, a comparison of the analysis for each user experience test result set of the plurality of user experience test result sets, wherein the comparison is used to implement at least one product design optimization to enhance user experiences with a product.

2. The method of claim 1, further comprising: generating, using the generative language model, a summary of the analysis; wherein the summary is combined with the second set of message fragments to generate the second set of automated prompts for the generative language model.

3. The method of claim 1, wherein the first set of automated prompts are constructed based at least in part on a combination of the first set of message fragments with each user experience test result set in the plurality of user experience test result sets.

4. The method of claim 1, wherein the second set of automated prompts includes a first prompt directing the generative language model to create the comparison and at least a second prompt directing the generative language model refine the comparison generated by the generative language model responsive to the first prompt.

5. The method of claim 4, wherein the second prompt directs the generative language model to refine the comparison to conform to a particular style format.

6. The method of claim 1, further comprising: identifying at least one design change associated with the product predicted to improve user experiences with the product based on the comparison.

7. The method of claim 1, wherein the comparison compares strengths and weaknesses of different versions of a design for the product.

8. The method of claim 1, wherein the comparison compares strengths and weaknesses of a product design with competitive products.

9. The method of claim 1, wherein implementing the product design optimization includes updating a webpage or application page predicted, by the generative language model, to optimize user experiences.

10. One or more non-transitory computer readable media storing instructions which, when executed by one or more hardware processors, cause:
   generating, by a process based at least in part on a first set of message fragments and a plurality of user experience test result sets, a first set of automated prompts for a generative language model to generate an analysis for each user experience test result set of the plurality of user experience test result sets;
   providing, by the process, the first set of automated prompts as input to the generative language model, wherein the generative language model applies at least one of a recurrent neural network or a transformer model to the first set of automated prompts;
   generating, by the process based at least in part on a second set of message fragments and the analysis for each user experience test result set of the plurality of user experience test result sets, a second set of automated prompts for the generative language model to compare at least part of different analyses for the plurality of user experience test result sets;
   providing, by the process, the first set of automated prompts as input to the generative language model, wherein the generative language model applies at least one of the recurrent neural network or the transformer model to the second set of automated prompts; and
   presenting, within a user interface based on at least one response received from the generative language model to the second set of automated prompts, a comparison of the analysis for each user experience test result set of the plurality of user experience test result sets, wherein the comparison is used to implement at least one product design optimization to enhance user experiences with a product.

11. The media of claim 10, wherein the instructions further cause: generating, using the generative language model, a summary of the analysis; wherein the summary is combined with the second set of message fragments to generate the second set of automated prompts for the generative language model.

12. The media of claim 10, wherein the first set of automated prompts are constructed based at least in part on a combination of the first set of message fragments with each user experience test result set in the plurality of user experience test result sets.

13. The media of claim 10, wherein the second set of automated prompts includes a first prompt directing the generative language model to create the comparison and at least a second prompt directing the generative language model refine the comparison generated by the generative language model responsive to the first prompt.

14. The media of claim 13, wherein the second prompt directs the generative language model to refine the comparison to conform to a particular style format.

15. The media of claim 10, wherein the instructions further cause: identifying at least one design change associated with the product predicted to improve user experiences with the product based on the comparison.

16. The media of claim 10, wherein the comparison compares strengths and weaknesses of different versions of a design for the product.

17. The media of claim 10, wherein the comparison compares strengths and weaknesses of a product design with competitive products.

18. A system comprising:
   one or more hardware processors; and
   one or more non-transitory computer readable media storing instructions which, when executed by one or more hardware processors, cause:
      generating, by a process based at least in part on a first set of message fragments and a plurality of user experience test result sets, a first set of automated prompts for a generative language model to generate an analysis for each user experience test result set of the plurality of user experience test result sets;
      providing, by the process, the first set of automated prompts as input to the generative language model, wherein the generative language model applies at least one of a recurrent neural network or a transformer model to the first set of automated prompts;
      generating, by the process based at least in part on a second set of message fragments and the analysis for each user experience test result set of the plurality of user experience test result sets, a second set of automated prompts for the generative language model to compare at least part of different analyses for the plurality of user experience test result sets;
      providing, by the process, the first set of automated prompts as input to the generative language model, wherein the generative language model applies at least one of the recurrent neural network or the transformer model to the second set of automated prompts; and
      presenting, within a user interface based on at least one response received from the generative language model to the second set of automated prompts, a comparison of the analysis for each user experience test result set of the plurality of user experience test result sets, wherein the comparison is used to implement at least one product design optimization to enhance user experiences with a product.

19. The system of claim 18, wherein the instructions further cause: generating, using the generative language model, a summary of the analysis; wherein the summary is combined with the second set of message fragments to generate the second set of automated prompts for the generative language model.

20. The media of claim 18, wherein the first set of automated prompts are constructed based at least in part on a combination of the first set of message fragments with each user experience test result set in the plurality of user experience test result sets.

* * * * *